United States Patent
Enomoto et al.

(10) Patent No.: US 7,378,340 B2
(45) Date of Patent: May 27, 2008

(54) METHOD OF MANUFACTURING SEMICONDUCTOR DEVICE AND SEMICONDUCTOR DEVICE

(75) Inventors: Yoshiyuki Enomoto, Kanagawa (JP); Hiroyuki Kawashima, Kanagawa (JP); Masaki Okamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 92 days.

(21) Appl. No.: 11/346,890

(22) Filed: Feb. 3, 2006

(65) Prior Publication Data

US 2006/0186548 A1  Aug. 24, 2006

(30) Foreign Application Priority Data

| Feb. 14, 2005 | (JP) | ............................... 2005-035414 |
| Dec. 15, 2005 | (JP) | ............................... 2005-361211 |

(51) Int. Cl.
*H01L 27/15* (2006.01)
(52) U.S. Cl. ...................... 438/622; 438/623; 438/625; 438/629; 257/E23.142; 257/E23.143; 257/E23.144; 257/E23.145; 257/E23.168; 257/E23.169
(58) Field of Classification Search ........ 257/758–760, 257/E23.001, E23.141–E23.145, E23.168–E23.169; 438/622–623, 625, 629
See application file for complete search history.

(56) References Cited

FOREIGN PATENT DOCUMENTS

| JP | 11-45887 | 2/1999 |
| JP | 2004-063859 | 2/2004 |

*Primary Examiner*—Andy Huynh
*Assistant Examiner*—Tony Tran
(74) *Attorney, Agent, or Firm*—Robert J. Depke; Rockey, Depke & Lyons, LLC.

(57) ABSTRACT

The present invention provides a method of manufacturing a semiconductor device and a semiconductor device that allow use of interlayer and interconnect insulating films having a low dielectric constant in forming a dual damascene structure. A first insulating film, a second insulating film, a first-mask forming layer, a second-mask forming layer, a third-mask forming layer, and a fourth-mask forming layer are sequentially deposited over a substrate. The fourth-mask forming layer is patterned to form a fourth mask having an interconnect trench pattern. After a resist mask is formed on the fourth mask, the layers to the second insulating film are etched to open via holes. The third-mask forming layer is etched through the fourth mask to thereby form a third mask having the interconnect trench pattern and to extend the via holes downward partway across the first insulating film. The second-mask forming layer is etched through the fourth mask to thereby form a second mask having the interconnect trench pattern, and the first insulating film that remains under the bottoms of the via holes is removed. Subsequently, the second insulating film is etched through the second mask to thereby form an interconnect trench, and then the second mask is removed.

6 Claims, 20 Drawing Sheets

METHOD OF MANUFACTURING SEMICONDUCTOR DEVICE AND SEMICONDUCTOR DEVICE

CROSS REFERENCES TO RELATED APPLICATIONS

The present invention contains subject matter related to Japanese Patent Application JP 2005-035414 filed with the Japanese Patent Office on Feb. 14, 2005 and Japanese Patent Application JP 2005-361211 filed with the Japanese Patent Office on Dec. 15, 2005, the entire contents of which being incorporated herein by reference.

BACKGROUND OF THE INVENTION

The present invention relates to a method of manufacturing a semiconductor device and a semiconductor device, and particularly to a method of manufacturing a semiconductor device having a multilevel interconnect structure based on a dual damascene structure that has a structural shape suitable for adoption of low dielectric constant (low-k) films as interlayer insulating films and insulating films among interconnects (interconnect insulating films), and the semiconductor device.

In step with size miniaturization and increase of integration degree of semiconductor devices, delays of electrical signals attributed to the time constant of interconnects are increasingly becoming a serious problem. Accordingly, for conductive layers in a multilevel interconnect structure, use of copper (Cu) interconnects, which have a low resistivity, has been advanced instead of aluminum (Al) alloy interconnects. The Cu, however, is difficult to pattern by dry etching unlike metal materials such as Al used in conventional multilevel interconnect structures. Therefore, typically multilevel Cu interconnect structures employ a damascene method, in which interconnect trenches are formed in insulating films, and then Cu films are buried in the interconnect trenches. In particular, a dual damascene method is attracting attention. In this method, after formation of via holes and interconnect trenches, Cu is buried in the holes and trenches simultaneously. The dual damascene method therefore is advantageous for reducing the number of steps. For example, Japanese Patent Laid-open No. Hei 11-45887 discloses this method.

In addition, in high-integration semiconductor devices, an increase of interconnect capacitance causes lowering of operation speed of the semiconductor devices. Therefore, It is essential to the semiconductor devices to employ minute multilevel interconnects for which low-k materials are used as interlayer and interconnect insulating films to suppress the increase of interconnect capacitance. Currently used as the low-k materials are substances having a dielectric constant of about 2.7, such as organic polymers typified by polyarylether (PAE) and inorganic materials typified by hydrogen silsesquioxane (HSQ) and methyl silsesquioxane (MSQ). In addition to these materials, in recent years, adoption of low-k materials having a dielectric constant of about 2.2 obtained by making the above-described materials porous is being promoted.

When the dual damascene method is applied to interlayer and interconnect insulating films including low-k material films, it is required to address the following technical restrictions.

The first restriction is that the compositions of the low-k material films are close to the composition of resist used for patterning, and therefore the low-k material films are readily damaged in a resist removal process. Specifically, it is essential that damage to the low-k material films can be suppressed in resist removal treatment after etching with use of a resist mask, and in resist reproduction treatment when a treated resist mask does not satisfy the product standard.

The second restriction is that the manufacturing process needs to have applicability to fabrication of a borderless structure, in which there is no alignment margin between interconnects and via holes. In step with miniaturization of semiconductor devices, employment of a manufacturing process compatible with a borderless structure becomes a major premise of achievement of multilevel interconnects after the 0.18 µm generation. Therefore, also in simultaneous formation, in a dual damascene method, of interconnect trenches and via holes in interlayer and interconnect insulating films including low-k materials, it is important to employ a process involving less variation in the via resistance due to misalignment.

The third restriction is that adoption of a layer with a comparatively high dielectric constant leads to an increase of interconnect capacitance. Specifically, in order to form interconnect trenches with adequately controlling the depth thereof, it is desirable to provide, near the bottoms of the interconnect trenches, a layer that has a large etching selection ratio with respect to interlayer and interconnect insulating films. However, when a layer with a comparatively high dielectric constant is used for that purpose, an increase of interconnect capacitance is caused. Therefore, there has been a need for a dual damascene process for an interlayer and interconnect insulating structure employing low-k materials, allowing control of formation of interconnect trenches combined with suppression of a capacitance increase.

As a dual damascene method that can address the above-described technical restrictions, a method has been proposed that will be described below with reference to FIGS. 7A to 7H, which are sectional views of manufacturing steps. For example, Japanese Patent Laid-open No. 2004-63859 discloses this method.

Referring initially to FIG. 7A, on a base insulating film 2 deposited on a silicon substrate 1, a multilayer film formed of a polyarylether (PAE) film 3 and a silicon dioxide film ($SiO_2$) 4 are deposited as an interconnect insulating film. Subsequently, buried interconnects (Cu interconnects) 7 formed of a copper (Cu) film are formed in interconnect trenches 5 provided in the interconnect insulating film with the intermediary of a barrier film 6 therebetween. An etching stopper film 8 composed of silicon carbide (SiC) is then formed on the Cu interconnects 7 and the $SiO_2$ film 4. This etching stopper film 8 also functions as a diffusion barrier film and an antioxidation film for the Cu.

Deposited on the etching stopper film 8 are a first insulating film 9 composed of MSQ, i.e., a carbon-doped silicon oxide film (SiOC film), and a second insulating film 10 composed of PAE as an organic insulating film. The formation of the films 9 and 10 is followed by sequential deposition of a first-mask forming layer 11 composed of $SiO_2$, a second-mask forming layer 12 composed of silicon nitride (SiN), and a third-mask forming layer 13 composed of $SiO_2$. Furthermore, a resist mask 14 having an interconnect trench pattern is formed on the third-mask forming layer 13.

Referring next to FIG. 7B, the third-mask forming layer ($SiO_2$) 13 (see FIG. 7A) is etched by dry etching that employs the resist mask 14 (see FIG. 7A) as the etching mask, to thereby form a third mask 13' having the interconnect trench pattern, which is then followed by ashing removal of the resist mask 14.

Referring next to FIG. 7C, a resist mask 15 having a via hole pattern is formed on the second-mask forming layer 12 and the third mask 13'. The resist mask 15 is formed so that at least part of apertures of the resist mask 15 overlaps with apertures of the interconnect trench pattern formed in the third mask 13'.

Subsequently, as shown in FIG. 7D, the third mask (SiO$_2$) 13', the second-mask forming layer (SiN) 12 and the first-mask forming layer (SiO$_2$) 11 are etched by dry etching that employs the resist mask 15 (see FIG. 7C) as the etching mask. In addition, the second insulating film (PAE) 10 is also perforated, which forms via holes 16 exposing the surface of the first insulating film (SiOC) 9. The resist mask 15 is removed in the etching of the second insulating film (PAE) 10, which is an organic material. Even when the resist mask 15 is completely removed during the perforation of the second insulating film 10, the formation of the via holes 16 having a favorable aperture shape are allowed due to the second-mask forming layer (SiN) 12 (see FIG. 7C) serving as the mask, since the second-mask forming layer 12 has the pattern of the via holes 16.

Referring next to FIG. 7E, by dry etching with use of the third mask (SiO$_2$) 13' having the interconnect trench pattern as the etching mask, the second-mask forming layer (SiN) 12 (see FIG. 7D) having the via hole pattern is etched to thereby form a second mask 12' having the interconnect trench pattern, and the first insulating film 9 is etched to an intermediate thickness thereof so that the via holes 16 are extended downward.

Referring next to FIG. 7F, by using the third mask (SiO$_2$) 13' (see FIG. 7E) and the second mask (SiN) 12' that have the interconnect trench pattern, part of the first-mask forming layer (SiO$_2$) 11 remaining in the interconnect trench region (see FIG. 7E) is removed to thereby form the first mask 11' having the interconnect trench pattern. In this removal, the first insulating film (SiOC) 9 remaining under the bottoms of the via holes 16 is etched, so that the via holes 16 expose the etching stopper film 8. The third mask 13' is removed in this etching step.

Subsequently, as shown in FIG. 7G, the etching stopper film 8 exposed through the bottoms of the via holes 16 is etched so that the via holes 16 are extended downward to reach the Cu interconnects 7, and the second mask 12' (see FIG. 7F) is removed. Thereafter, the second insulating film (PAE) 10 remaining under the bottom of the interconnect trench pattern is etched with use of the first mask (SiO$_2$) 11' having the interconnect trench pattern as the etching mask. Thus, the interconnect trench pattern provided in the first mask 11' is extended downward, which results in the formation of interconnect trenches 17 in the first mask 11' and the second insulating film 10. Accordingly, the state is obtained in which the interconnect trenches 17 communicate with the lower Cu interconnects 7 by the via holes 16.

After the above-described steps, by posttreatment employing chemicals and RF-sputtering treatment, etching fouling that remains on sidewalls of the interconnect trenches 17 and the via holes 16 are removed, and modified layers in the surfaces of the Cu interconnects 7 at the bottoms of the via holes 16 are normalized.

Referring next to FIG. 7H, a barrier metal film 18 composed of tantalum (Ta) is deposited by sputtering in a manner of covering the inside walls of the interconnect trenches 17 and the via holes 16. Subsequently, a conductive film (not shown) composed of Cu is deposited on the barrier metal film 18 by electrolytic plating or sputtering in a manner of filling the interconnect trenches 17 and the via holes 16. Thereafter, by using chemical mechanical polishing (CMP), extra part of the conductive film and the barrier metal film 18 unnecessary for the interconnect pattern is removed, and upper part of the first mask 11' is also removed. Thus, vias 19 composed of Cu are formed in the via holes 16 while Cu interconnects 20 are formed in the interconnect trenches 17, which allows achievement of a dual damascene multilevel interconnect structure. Moreover, an etching stopper film 21 composed of e.g. SiC is formed on the Cu interconnects 20 and the first mask 11', similarly to the etching stopper film 8 on the lower Cu interconnects 7.

Use of this dual damascene method employing three layers of etching masks eliminates the above-described technical restrictions regarding a low-k material structure, and allows a manufacturing method in which a load associated with resist patterning steps is light.

Specifically, as shown in FIGS. 7A and 7C, reproduction treatment of the resist masks 14 and 15 that are incompatible with the product standard can be implemented on the third-mask forming layer (SiO$_2$) 13 and the second-mask forming layer (SiN) 12. In addition, as described with reference to FIG. 7D, the removal of the resist mask 15 for opening the via holes 16 can be carried out simultaneously with the step of etching the second insulating film (PAE) 10 to extend the via holes 16. Therefore, resist removal can be implemented while suppressing damage to low-k material films.

Furthermore, as shown in FIG. 7C, the via holes 16 are formed through the third mask 13' having the interconnect trench pattern. Therefore, when the resist mask 15 having the via hole pattern is formed, the height of steps in the underlayer thereof is as large as only the thickness of the third mask 13'. Therefore, defocusing in exposure is suppressed, which can form a resist mask having a highly accurate via hole pattern. Moreover, as shown in FIG. 7D, since the via holes 16 are formed through the third mask 13' having the interconnect trench pattern, no variation in the size of the via holes 16 arises even if misalignment between the interconnect trenches 17 and the via holes 16 is caused.

In addition, as described with reference to FIG. 7G, when the second insulating film (PAE) 10 is etched to form the interconnect trenches 17, the etching of the second insulating film 10 is carried out on the first insulating film (SiOC) 9. Thus, a high etching selection ratio can easily be ensured. Therefore, the depth of the interconnect trenches 17 can easily be controlled without providing an etching stopper film composed of a high dielectric constant material such as an SiN film.

However, in the above-described dual damascene method, the first mask 11', which remains among interconnects even after completion of the device, is formed of an SiO$_2$ film. Therefore, the SiO$_2$ film, which has a dielectric constant of about 4, remains among the interconnects. Accordingly, even if an organic insulating film such as PAE is used as a lower interconnect insulating film to reduce the dielectric constant to some extent, it is difficult to reduce the effective dielectric constant among the interconnects. Thus, it is also difficult to reduce the interconnect capacitance.

If in the above-described technique, an SiOC film (k=3.0) is used in order to reduce the interconnect capacitance instead of the SiO$_2$ film 4 (k=4.1) serving as the insulating film among the lower Cu interconnects 7 and instead of the SiO$_2$ film (k=4.1) of the first-mask forming layer 11 (see FIG. 7A) serving as the insulating film among the upper Cu interconnects 20, the following problem arises.

The problem will be described with reference to FIG. 8A to FIG. 9. As shown in FIG. 8A, also when an SiOC film is used for the layers 4 and 11, the manufacturing process employs the same steps as those described with FIGS. 7A to 7E, i.e., until the step in which the second mask 12' is formed and the via holes 16 are extended downward partway across the first insulating film 9 with use of the third mask 13' as the etching mask. The first-mask forming layer 11 is formed to have a large thickness that includes both the thickness for interconnects and the thickness of sacrificial part to be removed in a CMP step to be carried out later.

Referring next to FIG. 8B, the first-mask forming layer (SiOC) 11 (see FIG. 8A) is etched to thereby form a first mask 11' having an interconnect trench pattern. In this step, the first insulating film (SiOC) 9 is also etched with the second insulating film (PAE) 10 with the via hole pattern serving as the mask, and therefore the via holes 16 are further extended downward so that the etching stopper film (SiC) 8 is exposed. In this etching, the etching selection ratio of SiOC to SiC (SiOC/SiC) is about 3. Since the first-mask forming layer (SiOC) 11 has a large thickness, the etching stopper film 8 is removed and thus the lower Cu interconnects 7 are exposed. Accordingly, the surfaces of the Cu interconnects 7 are susceptible to damage. In addition, in the region in which misalignment between the Cu interconnect 7 and the via hole 16 is caused, a hole A that reaches the PAE film 3 is formed in the SiOC film 4.

In the step of forming the first mask 11', dry etching is carried out by using the third mask (SiO$_2$) 13' (see FIG. 8A) having the interconnect trench pattern and the second mask (SiN) 12' as the etching mask. However, apertures of the interconnect trench pattern formed in the first-mask forming layer (SiOC) 11 become wider than the intended size. This is because the etching selection ratio of the first-mask forming layer 11 to the third and second masks 13' and 12' serving as the etching mask is not sufficiently high, and the first-mask forming layer 11 has a large thickness. Therefore, the thicknesses of the third and second masks 13' and 12' are insufficient to adequately etch the first-mask forming layer 11.

Referring next to FIG. 8C, under the above-described state, the second insulating film (PAE) 10 is etched by etching that employs the first mask 11' as the etching mask. Thus, the interconnect trench pattern provided in the first mask 11' is extended downward, which results in the formation of interconnect trenches 17 in the first mask 11' and the second insulating film 10. Subsequently, the barrier metal film 18 is deposited to cover the inside walls of the interconnect trenches 17 and the via holes 16, and then the conductive film 22 is formed on the barrier metal film 18 in a manner of filling the interconnect trenches 17 and the via holes 16.

Referring next to FIG. 9, by using CMP, extra part of the conductive film 22 (see FIG. 8C) and the barrier metal film 18 unnecessary as the interconnect pattern is removed, and upper part of the first mask 11' is also removed. Thus, vias 19 are formed in the via holes 16 while Cu interconnects 20 are formed in the interconnect trenches 17. Subsequently, an etching stopper film 21 is formed on the Cu interconnects 20 and the first mask 11'.

In the above-described manufacturing method, a void B is generated in the vias 19 and the interconnects 20 due to burying defects attributed to the hole A described with reference to FIG. 8B. Consequently, electromigration and stress migration due to the void B arise in the use environment of the semiconductor device, which deteriorates the interconnect reliability. In addition, if a hole A' arising from widening of the hole A is generated in the SiOC film 4 and the PAE film 3 due to the subsequent etching, defects of voltage-withstanding characteristic of the interconnect insulating film arises. As one approach for overcoming this problem, increasing the thickness of the first insulating film 9 in order to prevent the generation of the hole A is also possible. However, this thickness increase leads to a higher embodiment ratio of the via holes 16 formed in the first insulating film 9. Such a high aspect ratio probably leads to insufficient burying of the conductive film 22 (see FIG. 8C) into the via holes 16, which results in conduction defects.

Furthermore, since apertures of interconnect trench pattern of the first mask 11' are larger than the predetermined size, the widths of the interconnect trenches 17 are also larger than the predetermined size. Therefore, a sufficient voltage-withstanding characteristic between adjacent interconnects cannot be ensured, which lowers the yield of the semiconductor device. If in order to overcome this problem, the third mask 13' (see FIG. 8A) is formed to have a large thickness and then the first-mask forming layer 11 is etched with use of the third mask 13', the interconnect trench pattern with its size error being suppressed can be formed. However, since the via holes are extended downward in this etching with the second insulating film 10 having the via hole pattern serving as the mask, the first insulating film 9 and the etching stopper film 8 are etched, which exposes the surfaces of the Cu interconnects 7. In addition, the SiOC film 4, which is the lower layer, is also etched.

Against the above-described background, there is a need for the following manufacturing method of a semiconductor device and a semiconductor device obtained through the method. Specifically, by the method, the whole interlayer and interconnect insulating films are allowed to keep a low dielectric constant. In addition, in steps of forming interconnect trenches and via holes in the insulating films, the interconnect trenches can be formed with favorable processing controllability, without the occurrence of exposure of lower interconnects and etching of lower interconnect insulating films.

SUMMARY OF THE INVENTION

In order to solve the above-described problems, in a method of manufacturing a semiconductor device according to a first embodiment of the present invention, the following steps are sequentially implemented. Specifically, initially, (a) a first insulating film and a second insulating film are sequentially formed over a substrate that includes a lower interconnect in a region including a front surface of the substrate. The first insulating film serves as an interlayer insulating film between interconnect layers and is composed of a low-k material. The second insulating film serves as an insulating film among interconnects and is composed of a low-k material different from the material of the first insulating film. Next, (b) a first-mask forming layer, a second-mask forming layer, a third-mask forming layer, and a fourth-mask forming layer are sequentially formed over the second insulating film. The first-mask forming layer is composed of a low-k material different from the material of the second insulating film. The second-mask forming layer is composed of an insulating material different from the material of the first-mask forming layer. The third-mask forming layer is composed of an insulating material different from the material of the second-mask forming layer. The fourth-mask forming layer is composed of an insulating material different from the third-mask forming layer. Subsequently, (c) the fourth-mask forming layer is patterned to thereby form a fourth mask having an interconnect trench pattern. Thereafter, (d) a resist mask having a via hole pattern is formed on the fourth mask and the third-mask forming layer. In addition, (e) with use of the resist mask as an etching mask, the fourth mask, the third-mask forming layer, the second-mask forming layer, and the first-mask forming layer are etched, and then the second insulating film is etched, to thereby open a via hole. Next, (f) with use of the fourth mask as an etching mask, the third-mask forming layer is etched to thereby form a third mask having the interconnect trench pattern, and the first insulating film is etched to an intermediate thickness of the first insulating film to thereby extend the via hole downward. Subsequently, (g) with use of the fourth mask and the third mask as an etching mask, the second-mask forming layer is etched to thereby form a second mask having the interconnect trench pattern, and the first insulating film that remains under the bottom of the via hole is etched to thereby extend the via hole downward so that the via hole reaches the substrate. The fourth mask is removed as a result of the etching of the second-mask forming layer. Next, (h) the first-mask forming layer is etched with use of the third mask as an etching mask, to thereby form a first mask having the interconnect trench pattern. Thereafter, (i) after removal of the third mask, an interconnect trench is formed in the second insulating film with use of the second mask as an etching mask. In addition, (j) the second mask is removed after the forming of the interconnect trench.

In addition, in a method of manufacturing a semiconductor device according to a second embodiment of the present invention, the following steps are sequentially implemented. Specifically, initially, (a) a first insulating film and a second insulating film are sequentially formed over a substrate that includes a lower interconnect in a region including a front surface of the substrate. The first insulating film serves as an interlayer insulating film between interconnect layers and is composed of a low-k material. The second insulating film serves as an insulating film among interconnects and is composed of a low-k material different from the material of the first insulating film. Next, (b) a first-mask forming layer, a second-mask forming layer, a third-mask forming layer, and a fourth-mask forming layer are sequentially formed over the second insulating film. The first-mask forming layer is composed of a low-k material different from the material of the second insulating film. The second-mask forming layer is composed of an insulating material different from the material of the first-mask forming layer. The third-mask forming layer is composed of an insulating material different from the material of the second-mask forming layer. The fourth-mask forming layer is composed of an insulating material different from the third-mask forming layer. Subsequently, (c) the fourth-mask forming layer, the third-mask forming layer, and the second-mask forming layer are patterned to thereby form a via hole pattern in the fourth-mask forming layer, the third-mask forming layer, and the second-mask forming layer. Thereafter, (d) a resist mask having an interconnect trench pattern is formed over the fourth-mask forming layer having the via hole pattern. In addition, (e) the fourth-mask forming layer is etched with use of the resist mask as an etching mask, to thereby form a fourth mask having the interconnect trench pattern. Next, (f) the first-mask forming layer is etched with using, as an etching mask, the third-mask forming layer and the second-mask forming layer that have the via hole pattern, to thereby form the via hole pattern in the first-mask forming layer, and the third-mask forming layer is etched with using the fourth mask as an etching mask, to thereby form a third mask having the interconnect trench pattern. Subsequently, (g) a via hole is opened in the second insulating film with use of the second-mask forming layer having the via hole pattern as an etching mask. Next, (h) with use of the fourth mask and the third mask as an etching mask, the second-mask forming layer is etched to thereby form a second mask having the interconnect trench pattern, and the via hole is extended downward partway across the first insulating film. The fourth mask is removed as a result of the etching. Subsequently, (i) with use of the third mask as an etching mask, the first-mask forming layer is etched to thereby form a first mask having the interconnect trench pattern, and the first insulating film that remains under the bottom of the via hole is etched to thereby extend the via hole downward so that the via hole reaches the substrate. Thereafter, (j) after removal of the third mask, an interconnect trench is formed in the second insulating film with use of the second mask as an etching mask. In addition, (k) the second mask is removed after the forming of the interconnect trench.

In the manufacturing methods of a semiconductor device according to the first and second embodiments, after the interconnect trench is formed in the second insulating film, the first mask is left on the second insulating film and serves as an insulating film that defines the interconnect trench in association with the second insulating film. The first insulating film, the second insulating film, and the first mask are each formed of a low-k material. Thus, the dielectric constant of the whole interlayer and interconnect insulating films can be maintained at a low value.

If after the formation of the interconnect trench in the second insulating film, a conductive film is formed on the second mask in a manner of filling the interconnect trench pattern of the second and first masks, the interconnect trench, and the via hole, and then extra part of the conductive film unnecessary as an interconnect pattern is removed in addition to the second mask by CMP, the second-mask forming layer serves as sacrificial part to be removed by the CMP. Thus, the first-mask forming layer composed of a low-k material is allowed to have a smaller thickness compared with the case where the sacrificial part for the CMP is also composed of a low-k material. This small thickness of the first-mask forming layer suppresses the degree of downward extension of the via hole when the first-mask forming layer is etched to form the first mask, which prevents damage to lower interconnects provided in the substrate due to exposure of the lower interconnects. In addition, even when misalignment between the lower interconnect and the via hole is caused, the etching of a lower interconnect insulating film is suppressed. Thus, burying defects, voltage-withstanding characteristic defects, electromigration and stress migration attributed to holes due to the etching are suppressed.

Furthermore, since the first-mask forming layer composed of a low-k material is allowed to have a smaller thickness compared with the case where the sacrificial part for the CMP is also composed of a low-k material, the interconnect trench pattern can be formed in the first-mask forming layer with favorable processing controllability even if the etching selection ratios of the first-mask forming layer to the second-mask and third-mask forming layers, which serve as the etching mask, are not sufficiently high.

According to a third embodiment of the present invention, there is provided a semiconductor device having an insulating film that includes a low-k material having a dielectric constant smaller than the dielectric constant of silicon dioxide. The semiconductor device includes a first insulating film that is composed of a low-k material and is provided over a substrate, a second insulating film that is provided on the first insulating film and is composed of a low-k material different from the material of the first insulating film, and a third insulating film that is provided on the second insulating film and is composed of a low-k material different from the material of the second insulating film. The semiconductor device also includes a via that is provided in the first insulating film and reaches the substrate, an interconnect that is provided in the second insulating film and the third insulating film and communicates with the via, and a thin-film fourth insulating film that is provided on the whole or part of the third insulating film, and is composed of an insulating material different from the material of the third insulating film.

This semiconductor device is formed by the above-described manufacturing methods of a semiconductor device. In the semiconductor device, the first insulating film, the second insulating film and the third insulating film, in which the via and interconnect are provided, are each formed of a low-k material. Therefore, the dielectric constant of the whole interlayer and interconnect insulating films can be maintained at a low value.

As described above, according to the methods of manufacturing a semiconductor device and the semiconductor device obtained through any of the methods in accordance with the embodiments of the present invention, the dielectric constant of the whole interlayer and interconnect insulating films can be maintained at a low value, and thus the interconnect capacitance can be maintained at a low value. Accordingly, a high-performance semiconductor device with its operational delays being suppressed can be achieved. In addition, electromigration and stress migration are suppressed, which can enhance the interconnect reliability. Furthermore, the interconnect trench pattern can be formed with favorable processing controllability, and therefore a semiconductor device involving less size errors can be obtained, which prevents lowering of the yield.

DETAILED DESCRIPTION OF THE PREFERRED EMBODIMENTS

Embodiments of the present invention will be described in detail below with reference to the accompanying drawings.

First Embodiment

The following embodiment example shows a method of manufacturing a semiconductor device according to a first embodiment of the present invention. The first embodiment relates to the formation of a dual damascene structure by a trench-first approach, in which the formation of a mask pattern for forming interconnect trenches (interconnect trench pattern) precedes the formation of a mask pattern for forming via holes (via hole pattern). The first embodiment will be described below with reference to FIGS. 1A to 1K, which are sectional views illustrating manufacturing steps. The same elements in FIGS. 1A to 1K as those in FIG. 7A to FIG. 9 for the above-described manufacturing method as background techniques are given the same numerals.

Figure 1A:
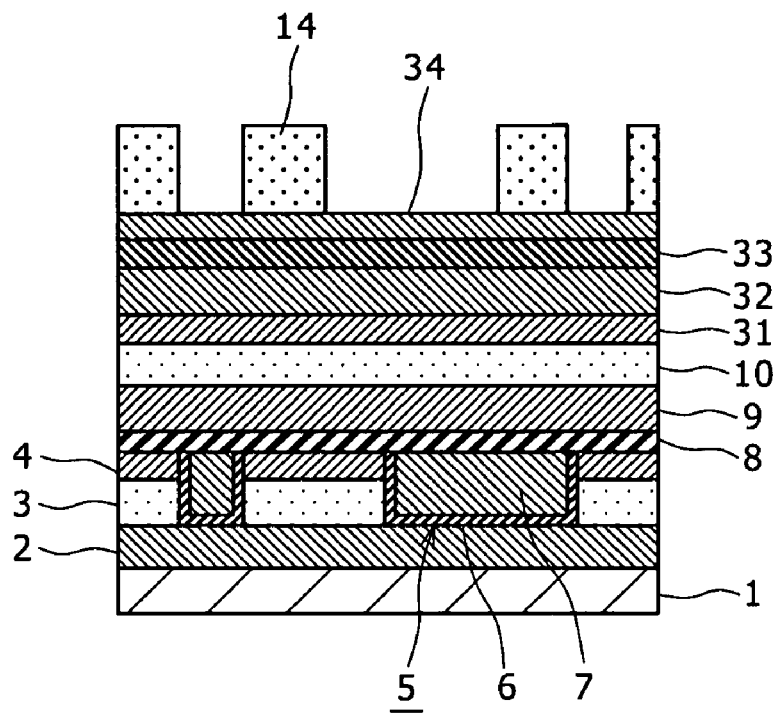
FIGS. 1A to 1K are sectional views for explaining manufacturing steps of a method of manufacturing a semiconductor device according to a first embodiment of the present invention.

Referring initially to FIG. 1A, over a base silicon substrate 1 having thereon element regions and so on (not shown), a multilayer film of a PAE film 3 (k=2.3) with a thickness of 90 nm and an SiOC film (MSQ) 4 (k=3.0) with a thickness of 140 nm is deposited as an interconnect insulating film with the intermediary of a base insulating film 2 between the substrate 1 and the multilayer film. Subsequently, interconnect trenches 5 are formed in the interconnect insulating film, and then buried interconnects composed of e.g. Cu (Cu interconnects) 7 are formed on barrier metals 6 in the interconnect trenches 5. The Cu interconnects 7 are designed to have an interconnect thickness of 140 nm. In the step of forming the buried interconnects, the SiOC film 4 is polished by CMP by 90 nm in thickness.

An etching stopper film 8 composed of e.g. SiC is then formed on the Cu interconnects 7 and the SiOC film 4. This etching stopper film 8 also functions as a diffusion barrier film and an antioxidation film for the Cu interconnects 7. The etching stopper film 8 prevents exposure of the Cu interconnects 7 and etching of the SiOC film 4 when a first insulating film formed on the etching stopper film 8 is etched to form via holes in later steps. The etching stopper film 8 is formed of SiC, which has a dielectric constant of 5. Therefore, in order to keep a low dielectric constant between interconnect layers, it is preferable that the thickness of the etching stopper film 8 is as small as possible, as long as the diffusion of Cu and etching of the lower film 4 can be prevented. In the present embodiment, the etching stopper film 8 has a thickness of e.g. 35 nm.

Formed on the etching stopper film 8 is a first insulating film 9 composed of a low-k material as an interlayer insulating film. Formed in the present embodiment is the first insulating film 9 that has a thickness of 90 nm and is formed of MSQ, i.e., carbon-doped silicon oxide (SiOC), which is an inorganic low-k material and has a dielectric constant of 2.3. Note that HSQ may be used instead of the MSQ for the first insulating film 9.

Formed on the first insulating film 9 is a second insulating film 10 composed of a low-k material that is different from the material of the first insulating film 9. This example employs an organic polymer as an organic low-k material for the second insulating film 10. For example, the second insulating film 10 has a thickness of 90 nm and is composed of polyarylether (PAE), which has a dielectric constant of 2.3. Note that benzocyclobutene (BCB) or fluorocarbon ($CF_x$) may be used instead of the PAE for the second insulating film 10.

The deposition of the second insulating film 10 is followed by sequential formation of a first-mask forming layer 31, a second-mask forming layer 32, a third-mask forming layer 33, and a fourth-mask forming layer 34.

The first-mask forming layer 31 is composed of e.g. an inorganic low-k material similar to the material of the first insulating film 9. Specifically, it is formed of e.g. an SiOC film (MSQ) having a dielectric constant of 3.0 and has a thickness of 50 nm. The first-mask forming layer 31 remains as an insulating film among interconnects formed in interconnect trenches even after the completion of the manufacturing process as described later. Therefore, it is formed of a low-k material in order to keep the dielectric constant of the interconnect insulating film at a low value.

The second-mask forming layer 32 is composed of e.g. a silicon-based insulating material that is different from the material of the first-mask forming layer (SiOC film) 31. It is preferable for the second-mask forming layer 32 to be composed of, of the silicon-based insulating materials, a material that allows processing of the first-mask forming layer 31 by reactive ion etching that employs a mask formed of the second-mask forming layer 32 as the etching mask. The second-mask forming layer 32 serves as sacrificial part to be removed in a later CMP step. In the present embodiment, the second-mask forming layer 32 composed of $SiO_2$ is formed to have a thickness of 90 nm.

The third-mask forming layer 33 is composed of a silicon-based insulating material different from the material of the second-mask forming layer 32. It is preferable for the third-mask forming layer 33 to be composed of, of the silicon-based insulating materials, a material that allows processing of the second-mask forming layer 32 by reactive ion etching that employs a mask formed of the third-mask forming layer 33 as the etching mask. Examples of the materials of the third-mask forming layer 33 include SiN and SiC. In the present embodiment, the third-mask forming layer 33 composed of SiN is formed to have a thickness of 50 nm.

The fourth-mask forming layer 34 is composed of a silicon-based insulating material different from the material of the third-mask forming layer 33. It is preferable for the fourth-mask forming layer 34 to be composed of, of the silicon-based insulating materials, a material that allows processing of the third-mask forming layer 33 by reactive ion etching that employs a mask formed of the fourth-mask forming layer 34 as the etching mask. In the present embodiment, the fourth-mask forming layer 34 composed of $SiO_2$ is formed to have a thickness of 50 nm.

After the mask-forming layers of the four-layer structure are formed in this manner, a resist mask 14 having a interconnect trench pattern is formed on the fourth-mask forming layer 34.

Figure 1B:
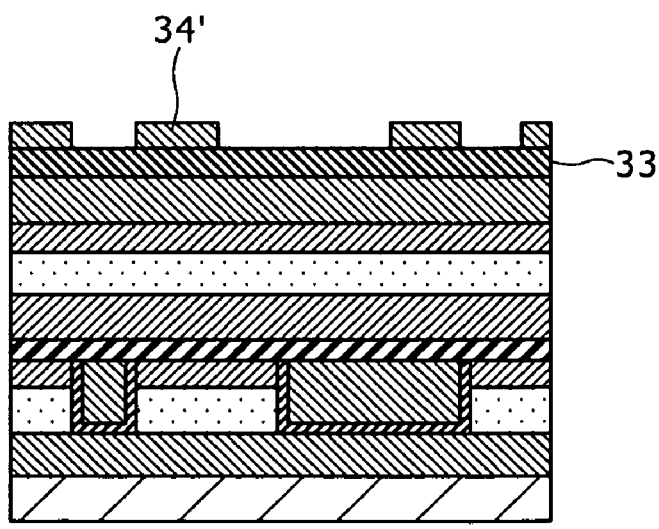

Referring next to FIG. 1B, the fourth-mask forming layer ($SiO_2$) 34 (see FIG. 1A) is etched by dry etching that employs the resist mask 14 (see FIG. 1A) as the etching mask, to thereby form a fourth mask ($SiO_2$) 34' having the interconnect trench pattern. In this dry etching, a typical magnetron etching apparatus is used, and e.g. octafluorobutane ($C_4F_8$), carbon oxide (CO), and argon (Ar) are employed as the etching gas. The gas flow ratio ($C_4F_8$:CO:Ar) is set to 1:5:20, and the bias power is set to 1200 W.

Under this etching condition, the etching selection ratio of $SiO_2$ to SiN ($SiO_2$/SiN) is 10 or more. Therefore, the etching of the fourth-mask forming layer 34 can be carried out almost without etching the third-mask forming layer (SiN) 33, which serves as the underlayer in the etching.

After the fourth mask 34' is thus formed, ashing treatment based on oxygen ($O_2$) plasma and treatment employing an organic amine chemical are implemented for example, to thereby completely remove the resist mask 14 and residual fouling produced in the etching treatment.

Figure 1C:
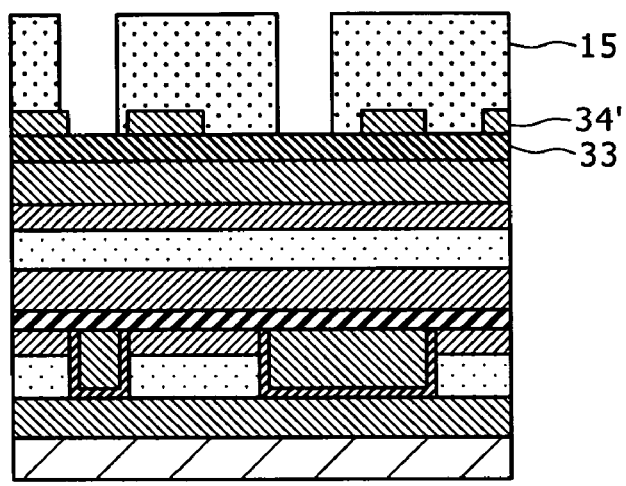

Referring next to FIG. 1C, a resist mask 15 having a via hole pattern is formed on the third-mask forming layer 33 and the fourth mask 34'. At this time, the resist mask 15 is patterned so that at least part of apertures of the via hole pattern provided in the resist mask 15 overlaps with apertures of the fourth mask 34'.

Figure 1D:
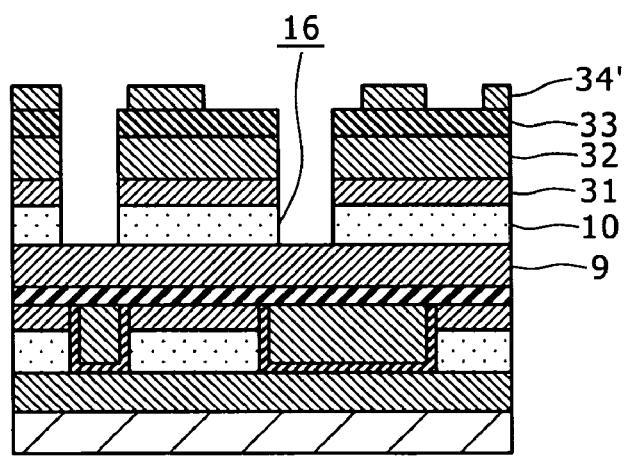

Referring next to FIG. 1D, by dry etching that employs the resist mask 15 (see FIG. 1C) as the etching mask, the fourth mask 34', the third-mask forming layer 33, the second-mask forming layer 32 and the first-mask forming layer 31 are etched, and then the second insulating film 10 is also etched. Thus, via holes 16 exposing the first insulating film 9 are formed.

In the dry etching for the layers from the fourth mask 34' to the first-mask forming layer 31, a typical magnetron etching apparatus is used and e.g. $C_4F_8$ and Ar are employed as the etching gas. The gas flow ratio ($C_4F_8$:Ar) is set to 1:4, and the bias power is set to 400 W.

In the present embodiment, the etching selection ratio among $SiO_2$, SiN and SiOC is about 1 under this etching condition. Therefore, simply by one etching step, four layers of the insulating films, i.e., the layers from the fourth mask 34' to the first-mask forming layer 31 are collectively etched to form the via holes 16. Alternatively, depending on the resist selection ratio, etching bias and so on, the layers from the fourth mask 34' to the first-mask forming layer 31 may be etched sequentially by using two or more etching steps.

In the subsequent etching for the second insulating film (PAE) 10, a typical high-density plasma etching apparatus is used and e.g. ammonium ($NH_3$) is employed as the etching gas. The RF power is set to 150 W. Under this etching condition, the etching rate of the resist mask 15 is almost the same as that of the second insulating film 10. Therefore, in the etching of the second insulating film 10, the thickness of the resist mask 15 gradually decreases and finally the resist mask 15 is completely removed. After the resist mask 15 is thus completely removed, the third-mask forming layer 33 having the via hole pattern serves as the etching mask, which allows achievement of favorable aperture shapes of the via holes 16. Under the etching condition of the etching for the second insulating film 10, the etching selection ratios of the second insulating film (PAE) 10 to SiN, $SiO_2$ and SiOC are all 100 or more.

Figure 1E:
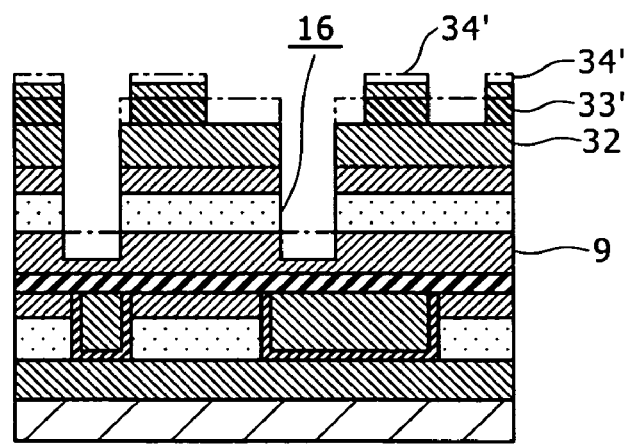

Referring next to FIG. 1E, the third-mask forming layer (SiN) 33 (see FIG. 1D) is etched by dry etching that employs the fourth mask ($SiO_2$) 34' having the interconnect trench pattern as the etching mask. Thus, a third mask 33' having the interconnect trench pattern is formed.

In this dry etching, a typical magnetron etching apparatus is used and difluoromethane ($CH_2F_2$), oxygen ($O_2$) and argon (Ar) are employed as the etching gas for example. The gas flow ratio ($CH_2F_2$:$O_2$:Ar) is set to 1:1:10, and the bias power is set to 300 W. Under this etching condition, the etching selection ratio of SiN to $SiO_2$ (SiN/$SiO_2$) is about 2 to 3. Therefore, although the thickness of the fourth mask ($SiO_2$) 34' decreases to some extent in the etching, the initial thickness of about 50 nm of the fourth mask 34' includes a sufficient margin to etch the third-mask forming layer (SiN) 33 with a thickness of 50 nm to thereby form the interconnect trench pattern in the third-mask forming layer 33.

In addition, under this etching condition, the etching selection ratio of SiOC to SiN (SiOC/SiN) is slightly lower than 1. Therefore, since the third-mask forming layer (SiN) 33 with a thickness of 50 nm is etched with consideration for requisite over etching therefore, the via holes 16 are extended downward by about 50 nm from the surface of the first insulating film (SiOC) 9.

Figure 1F:
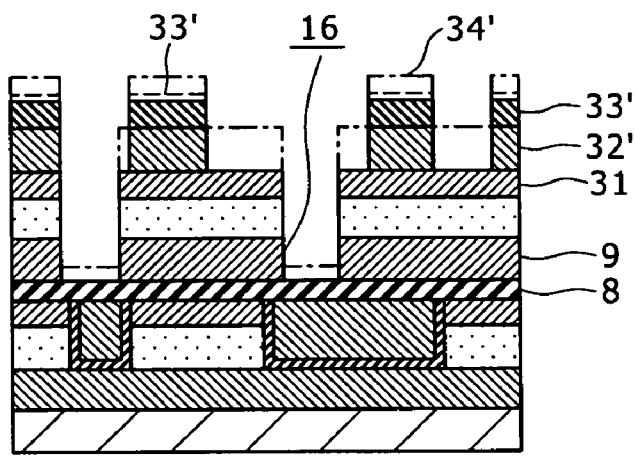

Subsequently, as shown in FIG. 1F, the second-mask forming layer (SiO$_2$) 32 (see FIG. 1E) is etched by dry etching in which the fourth mask (SiO$_2$) 34' (see FIG. 1E) and the third mask (SiN) 33' are used as the etching mask. Thus, a second mask 32' having the interconnect trench pattern is formed.

In this dry etching, a typical magnetron etching apparatus is used and C$_4$F$_8$, O$_2$ and Ar are employed as the etching gas for example. The gas flow ratio (C$_4$F$_8$:O$_2$:Ar) is set to 2:1:80, and the bias power is set to 800 W. In this etching, the fourth mask (SiO$_2$) 34' is also etched in step with the etching of the second-mask forming layer 32 since the fourth mask (SiO$_2$) 34' and the second-mask forming layer (SiO$_2$) 32 are formed of the same material (SiO$_2$). Under the above-described etching condition, the etching selection ratio of SiO$_2$ to SiN (SiO$_2$/SiN) is about 5. Therefore, although the thickness of the third mask (SiN) 33' decreases to some extent in the etching, the initial thickness of about 50 nm of the third mask (SiN) 33' includes a sufficient margin to etch the second-mask forming layer (SiO$_2$) 32 with a thickness of 90 nm to thereby form the interconnect trench pattern in the second-mask forming layer (SiO$_2$) 32. In addition, the etching selection ratio of SiO$_2$ to SiOC (SiO$_2$/SiOC) is about 1.5 in this etching. According to this etching selection ratio, the via holes 16 are further extended downward with the first-mask forming layer (SiOC) 31 having the via hole pattern serving as the mask, and thus the etching stopper film (SiC) 8 is exposed. Since the etching selection ratio of SiO$_2$ to SiC (SiO$_2$/SiC) is about 10 under the above-described etching condition, the etching stopper film (SiC) 8 is hardly etched.

Figure 1G:
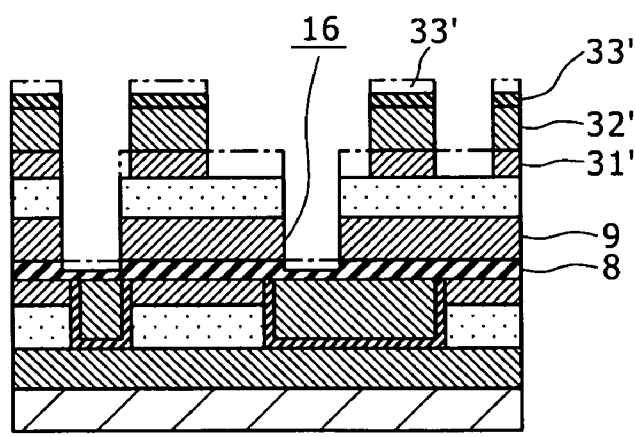

Referring next to FIG. 1G, the first-mask forming layer (SiOC) 31 (see FIG. 1F) is etched with using the third mask (SiN) 33' having the interconnect trench pattern. Thus, a first mask 31' having the interconnect trench pattern is formed.

In this dry etching, a typical magnetron etching apparatus is used and e.g. C$_4$F$_8$, Ar and nitrogen (N$_2$) are employed as the etching gas. The gas flow ratio (C$_4$F$_8$:Ar:N$_2$) is set to 1:200:4, and the bias power is set to 600 W. Under this etching condition, the etching selection ratio of SiOC to SiN (SiOC/SiN) is about 3. Before this etching, the thickness of the third mask (SiN) 33' has been decreased to about 30 nm in the etching step for the second mask 32' described with reference to FIG. 1F. However, since the etching selection ratio SiOC/SiN is 3, this thickness of about 30 nm of the third mask (SiN) 33' includes a sufficient margin to form the interconnect trench pattern in the first-mask forming layer (SiOC) 31 with a thickness of 50 nm. In addition, since the etching selection ratio of SiOC to SiC (SiOC/SiC) is about 3, the via holes 16 are extended downward by about 20 nm from the surface of the etching stopper film 8. However, since the etching stopper film 8 has a thickness of 35 nm, the lower Cu interconnects 7 are not exposed.

Figure 1H:
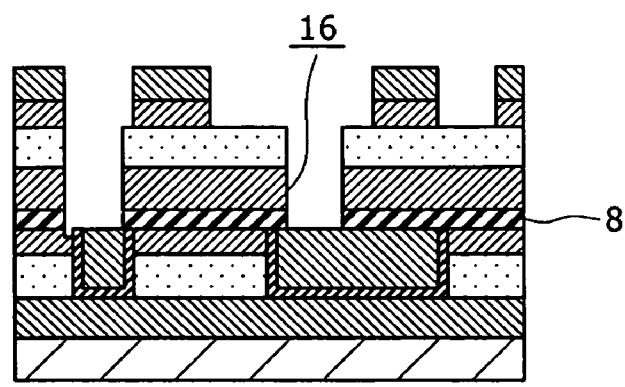

Referring next to FIG. 1H, the etching stopper film 8 remaining under the bottoms of the via holes 16 and the third mask (SiN) 33' (see FIG. 1G) are etch-removed. In this dry etching, a typical magnetron etching apparatus is used and CH$_2$F$_2$, O$_2$ and Ar are employed as the etching gas for example. The gas flow ratio (CH$_2$F$_2$:O$_2$:Ar) is set to 2:1:5, and the bias power is set to 100 W.

Figure 1I:
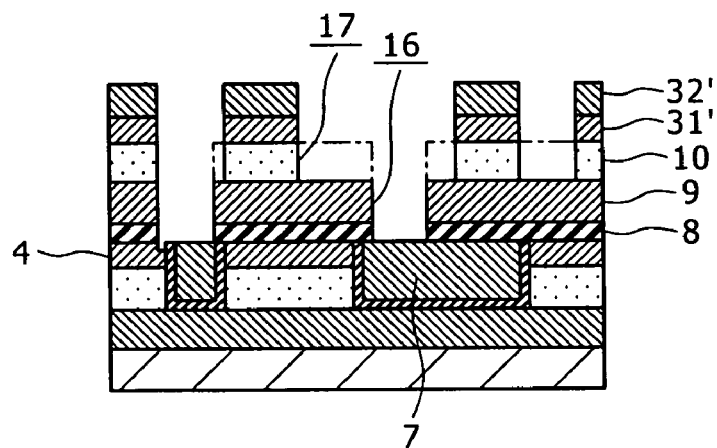

Subsequently, as shown in FIG. 1I, the second insulating film (PAE) 10 remaining under the bottom of the interconnect trench pattern in the first mask 31' is etched with use of the second mask (SiO$_2$) 32' as the etching mask. Thus, the interconnect trench pattern formed in the first mask 31' is extended downward, which results in the formation of interconnect trenches 17 in the second mask 32', the first mask 31' and the second insulating film 10. Accordingly, a state is achieved in which the interconnect trenches 17 communicate with the lower Cu interconnects 7 by the via holes 16.

In the present embodiment, the interconnect trench processing for the second insulating film 10 is carried out after the etching stopper film 8 and the third mask 33' are removed. Alternatively, the interconnect trench processing for the second insulating film 10 may precede the removal of the etching stopper film 8 and the third mask 33'.

In the etching for the second insulating film 10, a typical high-density plasma etching apparatus is used and e.g. NH$_3$ is employed as the etching gas. The RF power is set to 150 W. Under this etching condition, the etching selection ratio of PAE to SiOC (PAE/SiOC) is 100 or more. This etching selection ratio prevents thickness reduction of the first insulating film (SiOC) 9, which is the underlayer in the etching, and thus allows the downward extension of the interconnect trenches with favorable controllability and no variation in trench depth. In addition, this etching selection ratio suppresses the etching of the SiOC film 4 in the region in which misalignment between the via hole 16 and the lower Cu interconnect 7 is caused.

After the above-described steps, by posttreatment employing chemicals and RF-sputtering treatment, etching fouling that remains on sidewalls of the interconnect trenches and via holes are removed, and modified Cu layers at the bottoms of the via holes are converted to normal Cu layers.

Figure 1J:
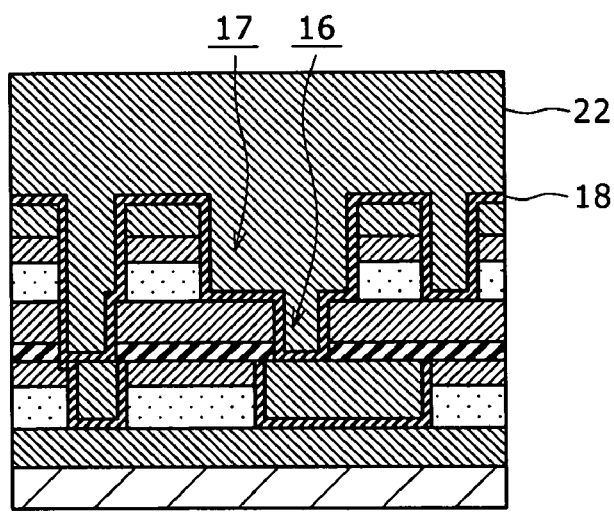

Thereafter, as shown in FIG. 1J, a barrier metal film 18 composed of e.g. Ta is deposited by sputtering in a manner of covering the inside walls of the interconnect trenches 17 and the via holes 16. Subsequently, a conductive film 22 composed of e.g. Cu is deposited on the barrier metal film 18 by electrolytic plating or sputtering in a manner of filling the interconnect trenches 17 and the via holes 16. Thus, the interconnect trenches 17 and the via holes 16 are simultaneously filled.

Figure 1K:
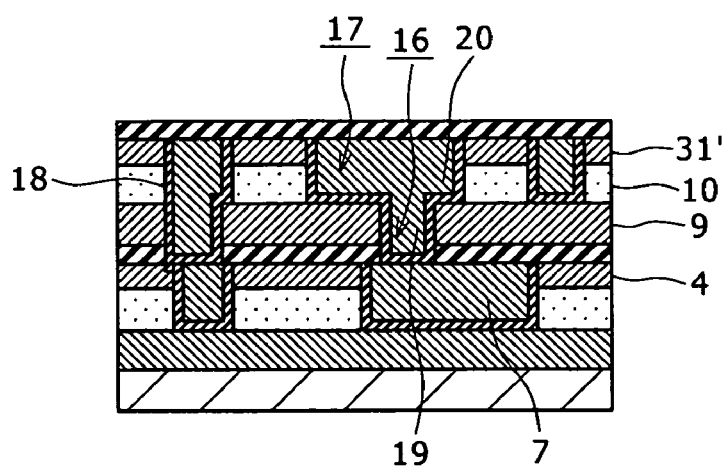

Referring next to FIG. 1K, by using CMP, extra part of the conductive film 22 (see FIG. 1J) and the barrier metal film 18 unnecessary as the interconnect pattern is removed, and the whole second mask 32' is also removed. Thus, vias 19 are formed in the via holes 16 while Cu interconnects 20 are formed in the interconnect trenches 17. Moreover, an etching stopper film 21 composed of e.g. SiC is formed on the Cu interconnects 20 and the first mask 31', similarly to the etching stopper film 8 on the lower Cu interconnects 7. Subsequent repetition of the steps from the forming step of the first insulating film 9 described with FIG. 1A to the step described with FIG. 1K allows the formation of a multilevel interconnect structure based on a dual damascene structure.

According to the above-described manufacturing method of a semiconductor device and a semiconductor device obtained through this method, the first mask 31' is left on the second insulating film 10, and serves as a third insulating film that defines the interconnect trenches 17 in association with the second insulating film 10. The first insulating film 9, the second insulating film 10, and the first mask 31' are each formed of a low-k material. Thus, the dielectric constant of the whole interlayer and interconnect insulating films can be maintained at a low value. Therefore, the interconnect capacitance can be maintained at a low value. Accordingly, a high-performance semiconductor device with its operational delays being suppressed can be achieved.

Since the second mask 32' in addition to extra part of the conductive film 22 and the barrier metal film 18 unnecessary as the interconnect pattern is removed by CMP until the surface of the first mask 31' is exposed, the second-mask forming layer 32 serves as sacrificial part to be removed by the CMP. Thus, the first-mask forming layer 31 composed of a low-k material is allowed to have a smaller thickness compared with the case where the sacrificial part for the CMP is also composed of a low-k material. Accordingly, the downward extension of the via holes 16 is suppressed in the step of etching the first-mask forming layer 31 to form the first mask 31', and thus the exposure of the Cu interconnects 7 is prevented, which avoids damage to the Cu interconnects 7. In addition, even when misalignment between the Cu interconnect 7 and the via hole 16 is caused, the etching of the SiOC film 4 is suppressed. Thus, troubles in filling the via holes 16 attributed to the etching of the SiOC film 4, and electromigration and stress migration due to the filling troubles are avoided. The interconnect reliability therefore can be enhanced.

Furthermore, since the first-mask forming layer 31 is allowed to have a small thickness, the interconnect trench pattern of the first mask 31' can be formed with favorable processing controllability by use of the third mask 33' as the etching mask. Accordingly, a semiconductor device involving less size errors can be obtained, which prevents lowering of the yield.

It should be noted that the present invention is not limited to the above-described embodiment, in which Cu is used as the material of the interconnects and vias, but any other conductive material is also available.

First Modification

Figure 2:
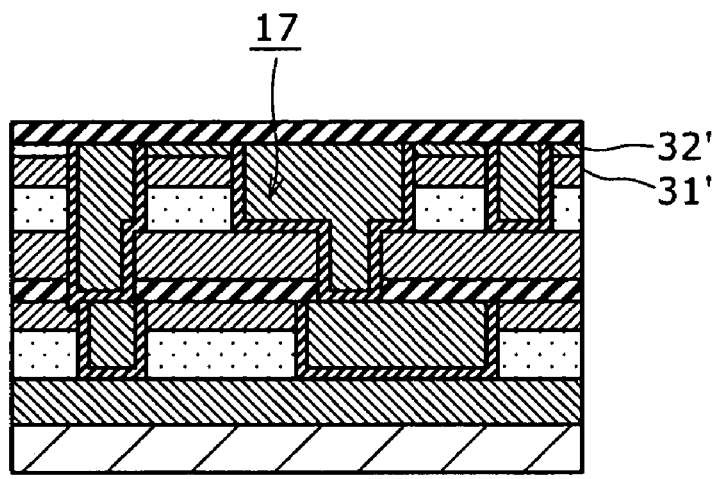
FIG. 2 is a sectional view for explaining a method of manufacturing a semiconductor device as a first modification of the first embodiment.

In the above description, the whole second mask 32' is removed by CMP. Alternatively, as shown in FIG. 2, the thin-film second mask 32' may remain on the entire first mask 31'. In this structure, the first mask 31' serves as a third insulating film that defines the interconnect trenches 17, while the second mask 32' serves as a fourth insulating film that also defines the interconnect trenches 17.

Figure 3:
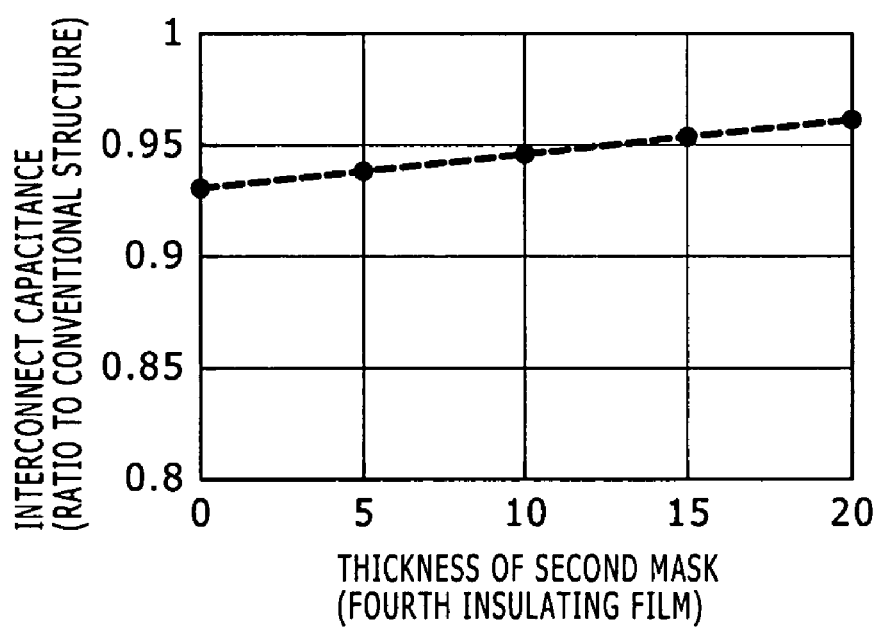
FIG. 3 is a graph showing the interconnect capacitances of semiconductor devices manufactured by the method according to the first modification, as a function of the thickness of a remaining second mask.

FIG. 3 is a graph showing the interconnect capacitance of the structure of FIG. 2 as a function of the thickness of the second mask 32' (the fourth insulating film) that remains on the first mask 31' (the third insulating film) with a thickness of 50 nm. In the graph, the interconnect capacitances are plotted with the thickness of the second mask 32' being changed from 0 nm to 20 nm with an increment of 5 nm. The semiconductor device in which the thickness of the second mask 32' (see FIG. 2) is 0 is obtained through the same method as that of the first embodiment. Note that the interconnect capacitances in this graph are indicated as the ratio with respect to the interconnect capacitance of the semiconductor device having a conventional structure shown in FIG. 7H as a background technique. That is, the interconnect capacitance of the conventional structure is defined as 1.

This graph shows that, when the thickness of the second mask 32' is 20 nm or smaller, an interconnect capacitance smaller by 3 to 7% than that of the semiconductor device with the conventional structure is obtained.

In the first modification, the second mask 32' remains on the entire first mask 31' as shown in FIG. 2. Another modification, however, is also applicable in which the second mask 32' remains on part of the first mask 31'. Even in this modification, polishing can be carried out without involving problems about the flatness and so on, if the polishing selection ratio of $SiO_2$ to SiOC in CMP is set to about 1.

Second Embodiment

A method of manufacturing a semiconductor device according to a second embodiment of the present invention will be described below with reference to FIGS. 4A to 4K, which are sectional views illustrating manufacturing steps. The same elements in the second embodiment as those in the first embodiment are given the same numerals, and detailed description thereof will be omitted.

Figure 4A:
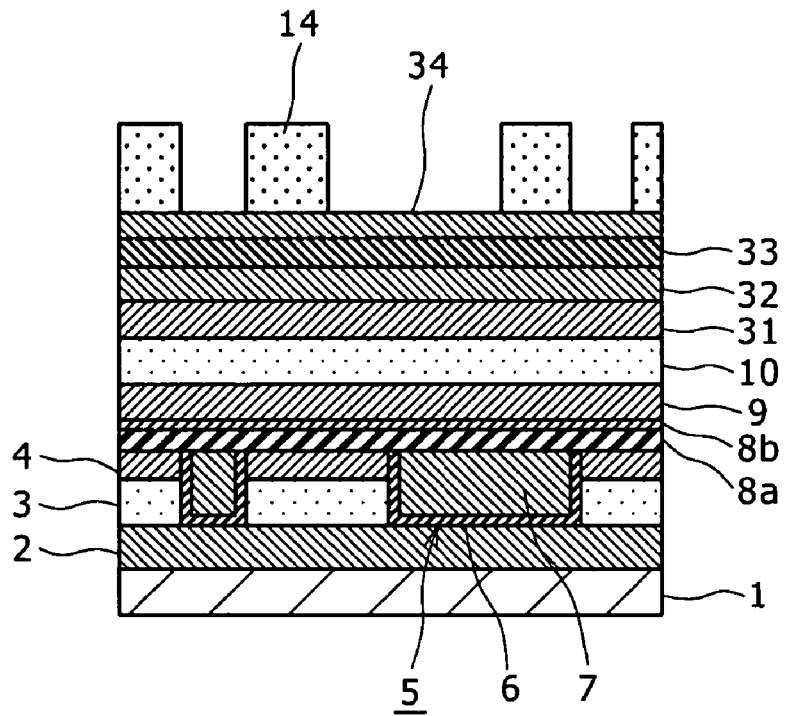
FIGS. 4A to 4K are sectional views for explaining manufacturing steps of a method of manufacturing a semiconductor device according to a second embodiment of the present invention.

Referring initially to FIG. 4A, in the second embodiment, the manufacturing process is advanced in the same way as the first embodiment until the step of forming Cu interconnects 7 in a PAE film 3 and an SiOC film 4 after sequential deposition of the PAE film 3 and the SiOC film 4 over a substrate 1 with the intermediary of a base insulating film 2 therebetween.

Subsequently, a first etching stopper film 8a and a second etching stopper film 8b are sequentially formed on the Cu interconnects 7 and the SiOC film 4. The first etching stopper film 8a is composed of SiC and has a thickness of 35 nm for example. The second etching stopper film 8b is composed of such a material that the second etching stopper film 8b is less susceptible to being etched than the first etching stopper film 8a when via holes are formed in a first insulating film 9 on the second etching stopper film 8b in a later step.

In the present embodiment, the second etching stopper film 8b is formed of an $SiO_2$ film (SR—$SiO_2$ film) of which silicon content is higher than that of an $SiO_2$ film deposited by normal plasma-enhanced CVD (PECVD). The dielectric constant of the SR—$SiO_2$ film is 4.3. This SR—$SiO_2$ film is formed by increasing the amount of silicon-containing components in the film-deposition gas in PECVD. In the deposition of the SR—$SiO_2$ film, a parallel plasma PECVD apparatus is used, and silane ($SiH_4$), dinitrogen monoxide ($N_2O$) and $N_2$ are used as the film-deposition gas. The gas flow ratio ($SiH_4$:$N_2O$:$N_2$) is set to 1:17:5, and the RF power and pressure are set to 600 W and 350 Pa, respectively. Whether or not the SR—$SiO_2$ film is formed can be confirmed by the refractive index of the deposited film. Specifically, the refractive index of a normal $SiO_2$ film is 1.46, while that of the SR—$SiO_2$ film is 1.5 or higher.

Since the dielectric constant of the SR—$SiO_2$ is 4.3, it is preferable for the SR—$SiO_2$ film to have a thickness of 20 nm or smaller in order to reduce the dielectric constant of the entire semiconductor device. A thickness of 20 nm or smaller allows the interconnect capacitance of the formed semiconductor device to be maintained at a low value. In the present embodiment, the second etching stopper film 8b composed of an SR—$SiO_2$ film is formed to have a thickness of 10 nm.

Deposited on the second etching stopper film 8b is the first insulating film 9 composed of e.g. SiOC and having a thickness of 80 nm as an interlayer insulating film. On the first insulating film 9, a second insulating film 10 composed of e.g. PAE and having a thickness of 90 nm is formed.

The deposition of the second insulating film 10 is followed by sequential formation of a first-mask forming layer 31, a second-mask forming layer 32, a third-mask forming layer 33 and a fourth-mask forming layer 34. The materials of the first- to fourth-mask forming layers 31 to 34 are the same as those in the first embodiment. In contrast, the thicknesses of the layers 31 to 34 are different from those in the first embodiment.

Specifically, the first-mask forming layer 31 on the second insulating film (PAE) 10 is composed of e.g. SiOC and has a thickness of 70 nm. In the present embodiment, interconnects having a interconnect thickness of 140 nm are formed in the first-mask forming layer 31 with a thickness of 70 nm and the second insulating film 10 with a thickness of 90 nm as described later. Therefore, the upper part with a thickness of 20 nm in the first-mask forming layer 31 serves as sacrificial part to be removed in a later CPM step.

The second-mask forming layer 32 is composed of $SiO_2$ and has a thickness of 70 nm. The second-mask forming layer 32 has a thickness smaller by 20 nm than that in the first embodiment since the upper part of the first-mask forming layer 31 serves as sacrificial part for CMP as described above. The third-mask forming layer 33 is composed of SiN and is 50 nm in thickness. The fourth-mask forming layer 34 is composed of $SiO_2$ and is 50 nm in thickness.

After the mask-forming layers of the four-layer structure are formed in this manner, a resist mask 14 having a interconnect trench pattern is formed on the fourth-mask forming layer 34.

Figure 4B:
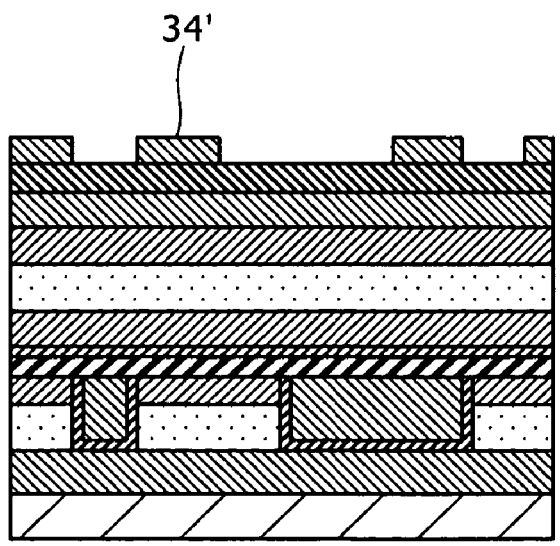

Referring next to FIG. 4B, the fourth-mask forming layer ($SiO_2$) 34 (see FIG. 4A) is etched by dry etching that employs the resist mask 14 (see FIG. 4A) as the etching mask, to thereby form a fourth mask 34' having the interconnect trench pattern. The etching condition of this etching is the same as that in the first embodiment. Subsequently, ashing treatment based on $O_2$ plasma and treatment employing an organic amine chemical are implemented for example, to thereby completely remove the resist mask 14 and residual fouling produced in the etching treatment.

Figure 4C:
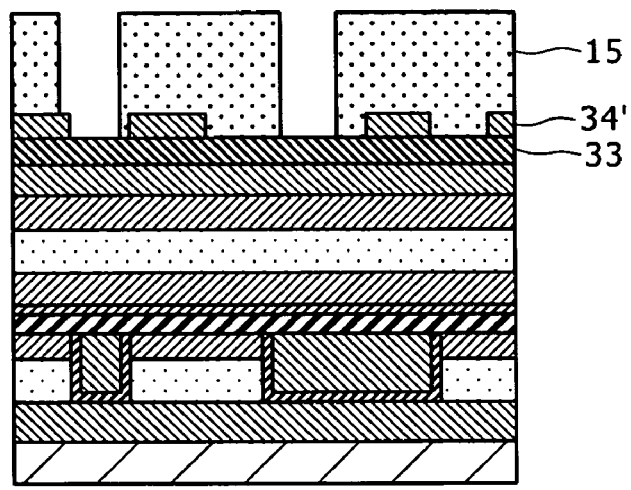

Referring next to FIG. 4C, a resist mask 15 having a via hole pattern is formed on the third-mask forming layer 33 and the fourth mask 34'. At this time, the resist mask 15 is patterned so that at least part of apertures of the via hole pattern provided in the resist mask 15 overlaps with apertures of the fourth mask 34'.

Figure 4D:
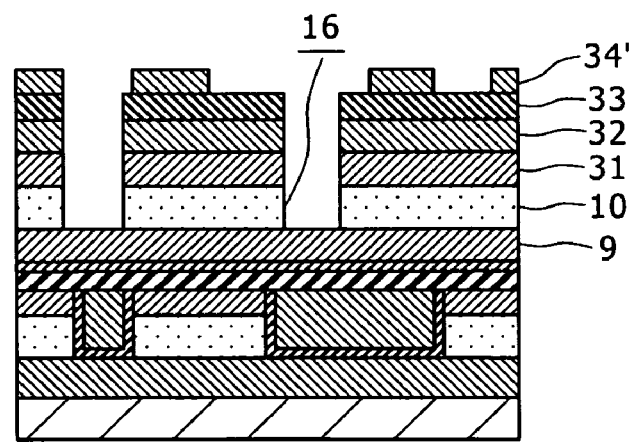

Referring next to FIG. 4D, by dry etching that employs the resist mask 15 (see FIG. 4C) as the etching mask, the fourth mask 34', the third-mask forming layer 33, the second-mask forming layer 32 and the first-mask forming layer 31 are etched, and then the second insulating film 10 is also etched. Thus, via holes 16 exposing the first insulating film 9 are formed. This etching employs the same etching condition as that in the first embodiment. The resist mask 15 is removed in the etching of the second insulating film (PAE) 10.

Figure 4E:
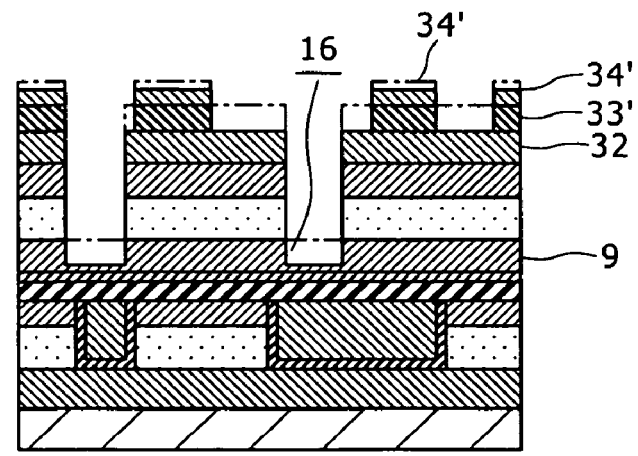

Referring next to FIG. 4E, the third-mask forming layer (SiN) 33 (see FIG. 4D) is etched by dry etching in which the fourth mask ($SiO_2$) 34' having the interconnect trench pattern is used as the etching mask. Thus, a third mask 33' having the interconnect trench pattern is formed.

Figure 4F:
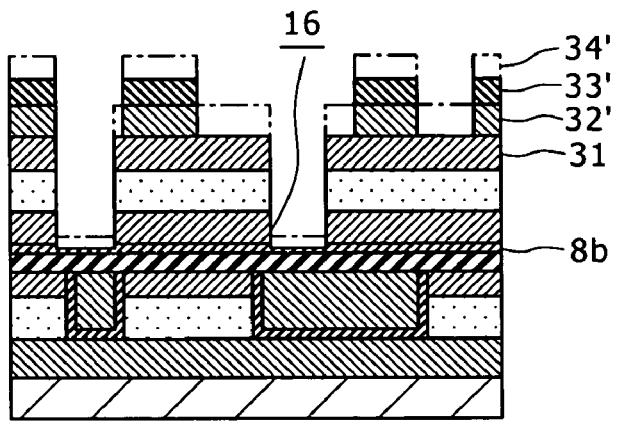

Subsequently, as shown in FIG. 4F, the second-mask forming layer ($SiO_2$) 32 (see FIG. 4E) is etched by dry etching in which the fourth mask ($SiO_2$) 34' (see FIG. 4E) and the third mask (SiN) 33' having the interconnect trench pattern are used as the etching mask. Thus, a second mask 32' having the interconnect trench pattern is formed.

This dry etching employs the same etching condition as that in the first embodiment. In this etching, the fourth mask 34' is also etched in step with the etching of the second-mask forming layer 32 since the fourth mask ($SiO_2$) 34' and the second-mask forming layer 32 ($SiO_2$) are formed of the same material ($SiO_2$). The etching selection ratio of $SiO_2$ to SiN ($SiO_2$/SiN) is about 5 in this etching. Therefore, although the thickness of the third mask (SiN) 33' decreases to some extent in the etching, the initial thickness of about 50 nm of the third mask 33' includes a sufficient margin to etch the second-mask forming layer ($SiO_2$) 32 (see FIG. 4E) with a thickness of 70 nm to thereby form the interconnect trench pattern in the second-mask forming layer 32. As a result of this etching, the thickness of the third mask 33' decreases to about 35 nm.

In addition, the etching selection ratio of $SiO_2$ to SiOC ($SiO_2$/SiOC) is about 1.5 in this etching. According to this etching selection ratio, the via holes 16 are further extended downward with the first-mask forming layer 31 having the via hole pattern serving as the etching mask, and thus the second etching stopper film (SR—$SiO_2$) 8b is exposed. Moreover, since the etching selection ratio of $SiO_2$ to SR—$SiO_2$ ($SiO_2$/SR—$SiO_2$) is about 4, the SR—$SiO_2$ film is etched by about 7 nm in thickness.

Figure 4G:
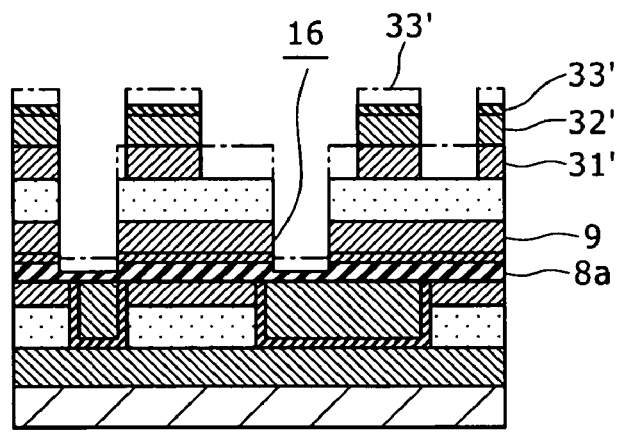
Figure 4H:
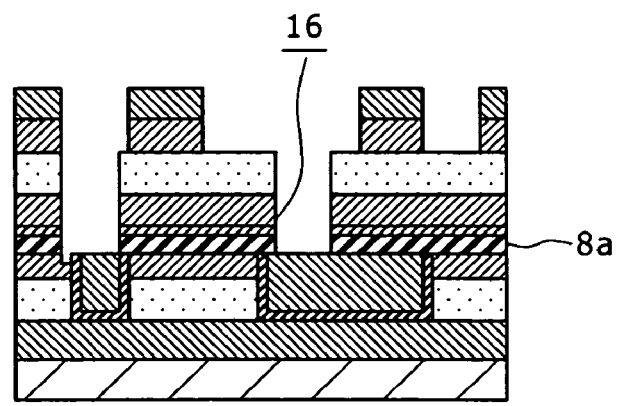

Referring next to FIG. 4G, the first-mask forming layer (SiOC) 31 (see FIG. 4F) is etched with using the third mask (SiN) 33' having the interconnect trench pattern as the etching mask. Thus, a first mask (SiOC) 31' having the interconnect trench pattern is formed.

When this dry etching employs the same etching condition as that in the first embodiment, the etching selection ratio of SiOC to SiN (SiOC/SiN) is about 3. Before this etching, the thickness of the third mask (SiN) 33' has been decreased to about 35 nm in the step of forming the second mask 32' described with reference to FIG. 4F. However, since the etching selection ratio SiOC/SiN is 3, this thickness of about 30 nm of the third mask (SiN) 33' includes a sufficient margin to form the interconnect trench pattern in the first-mask forming layer (SiOC) 31 with a thickness of 70 nm. Moreover, in this etching, the etching selection ratio of SiOC to SR—$SiO_2$ (SiOC/SR—$SiO_2$) is 5, and the etching selection ratio of SiOC to SiC (SiOC/SiC) is 3. Therefore, the via holes 16 penetrate the second etching stopper film 8b, and are extended downward by about 20 nm from the surface of the first etching stopper film 8a. However, since the first etching stopper film 8a has a thickness of 35 nm, exposure of the lower Cu interconnects 7 is avoided.

The subsequent steps are carried out in the same way as the first embodiment. Specifically, referring next to FIG. 4H, the third mask 33' (see FIG. 4G) and the first etching stopper film 8a remaining under the bottoms of the via holes 16 are etch-removed.

Figure 4I:
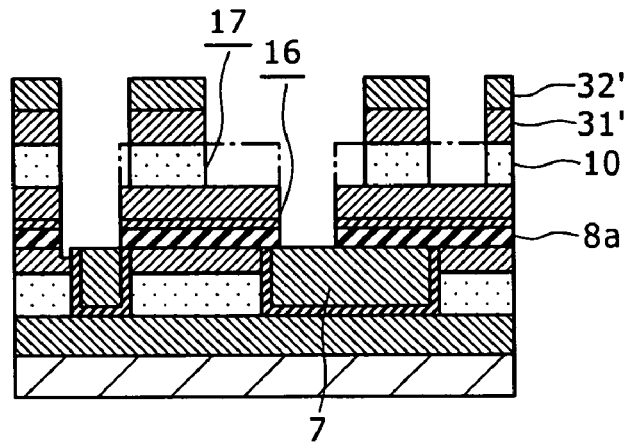

Subsequently, as shown in FIG. 4I, the second insulating film (PAE) 10 remaining under the bottom of the interconnect trench pattern in the first mask ($SiO_2$) 31' is etched with use of the second mask ($SiO_2$) 32' as the etching mask. Thus, the interconnect trench pattern formed in the first mask 31' is extended downward, which results in the formation of interconnect trenches 17 in the second mask 32', the first mask 31' and the second insulating film 10.

After the above-described steps, by posttreatment employing chemicals and RF-sputtering treatment, etching fouling that remains on sidewalls of the interconnect trenches 17 and the via holes 16 are removed, and modified Cu layers at the bottoms of the via holes 16 are converted to normal Cu layers.

Figure 4J:
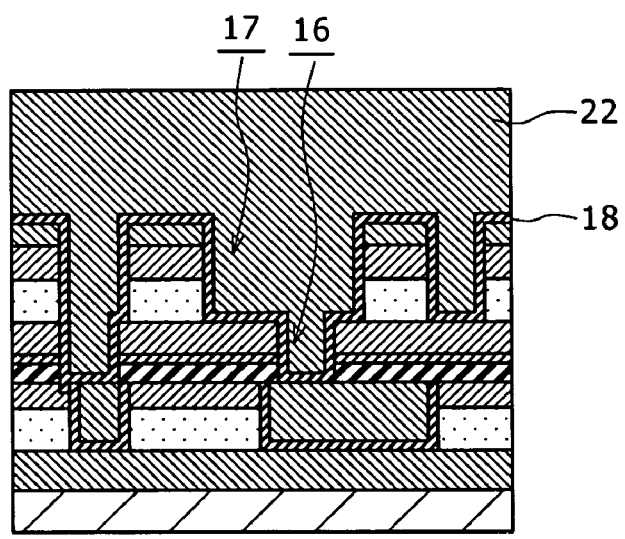

Thereafter, as shown in FIG. 4J, a barrier metal film 18 is deposited by sputtering in a manner of covering the inside walls of the interconnect trenches 17 and the via holes 16. Subsequently, a conductive film 22 composed of Cu is deposited on the barrier metal film 18 by electrolytic plating or sputtering in a manner of filling the interconnect trenches 17 and the via holes 16. Thus, the interconnect trenches 17 and the via holes 16 are simultaneously filled.

Figure 4K:
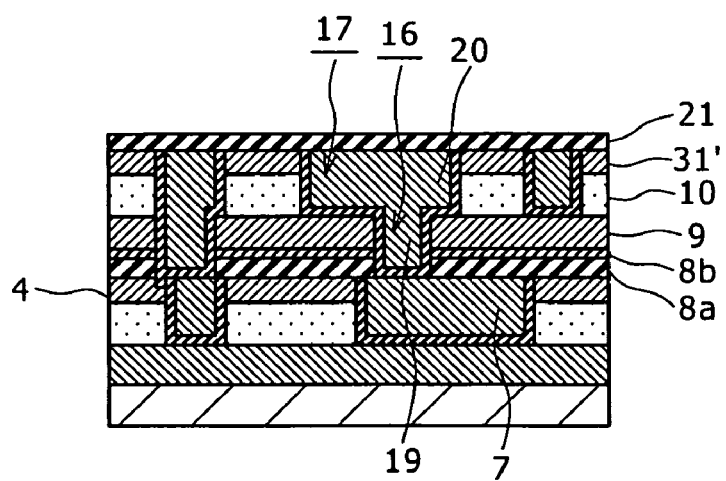

Referring next to FIG. 4K, by using CMP, extra part of the conductive film 22 (see FIG. 4J) and the barrier metal film 18 unnecessary as the interconnect pattern is removed. In addition, the whole second mask 32' and upper part of the first mask 31' are also removed. Thus, vias 19 are formed in the via holes 16 while Cu interconnects 20 are formed in the interconnect trenches 17. Moreover, an etching stopper film 21 composed of SiC is formed on the Cu interconnects 20 and the first mask 31', similarly to the etching stopper film 8 on the lower Cu interconnects 7. Accordingly, a multilevel interconnect structure based on a dual damascene structure can be achieved.

According to the above-described manufacturing method of a semiconductor device, the first mask 31' is left on the second insulating film 10, and serves as a third insulating film that defines the interconnect trenches in association with the second insulating film 10. Since the first insulating film 9, the second insulating film 10 and the first mask 31' are each formed of a low-k material, the second embodiment can offer the same advantages as those of the first embodiment.

Moreover, in the present embodiment, the whole second mask 32' and upper part of the first mask 31' in addition to extra part of the conductive film 22 unnecessary as the interconnect pattern are removed by CMP. Thus, the second mask 32', which has a high dielectric constant, can surely be removed. This ensured removal of the second mask 32' facilitates control of the dielectric constant compared with the case where polishing residues of the second mask 32' partially remain.

In addition, the existence of the second etching stopper film 8b between the first etching stopper film 8a and the first insulating film 9 can prevent exposure of the lower Cu interconnects 7 and etching of the SiOC film 4 more surely.

Note that features of the above-described modifications of the first embodiment are available also in the second embodiment.

Third Embodiment

A method of manufacturing a semiconductor device according to a third embodiment of the present invention will be described below with reference to FIGS. 5A to 5M, which are sectional views illustrating manufacturing steps. The third embodiment relates to the formation of a dual damascene structure by a via-first approach, in which the formation of a mask pattern for forming via holes (via hole pattern) precedes the formation of a mask pattern for forming interconnect trenches (interconnect trench pattern). The same elements in the third embodiment as those in the first embodiment are given the same numerals, and detailed description thereof will be omitted.

Figure 5A:
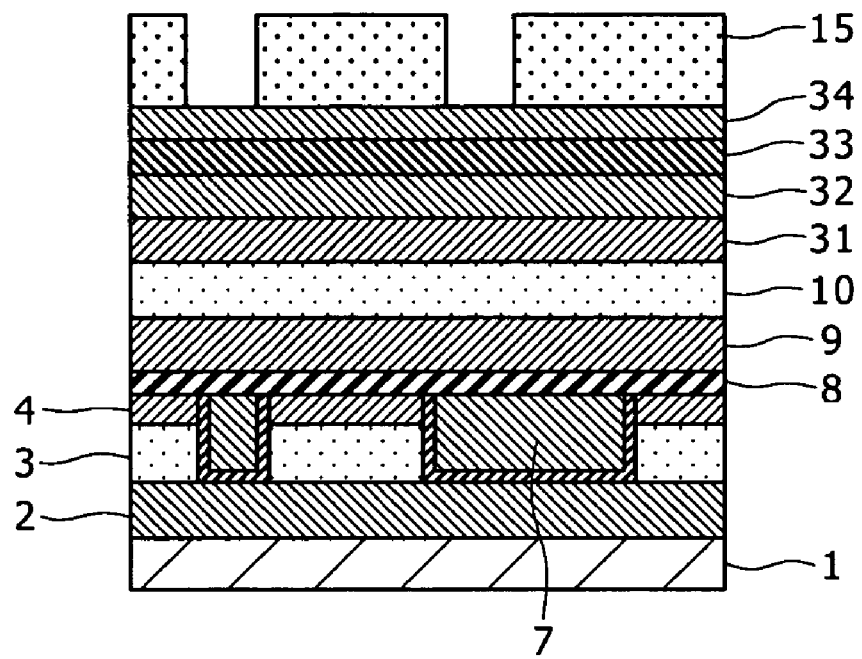
FIGS. 5A to 5M are sectional views for explaining manufacturing steps of a method of manufacturing a semiconductor device according to a third embodiment of the present invention.

Referring initially to FIG. 5A, a PAE film 3 and an SiOC film 4 are sequentially deposited over a substrate 1 with the intermediary of a base insulating film 2 therebetween, and then Cu interconnects 7 are formed in the PAE film 3 and the SiOC film 4. Subsequently, an etching stopper film 8, a first insulating film 9 and a second insulating film 10 are sequentially deposited over the Cu interconnects 7 and the SiOC film 4. The steps thus far are carried out in the same way as the first embodiment.

Subsequently, sequentially formed over the second insulating film 10 are a first-mask forming layer 31, a second-mask forming layer 32, a third-mask forming layer 33 and a fourth-mask forming layer 34, similarly to the first embodiment. The materials and deposition methods of the respective mask forming layers are the same as those in the first embodiment. In contrast, the thicknesses of the layers in the third embodiment are different from those in the first embodiment. Specifically, the thicknesses of the first- to fourth-mask forming layers 31, 32, 33 and 34 are 70 nm, 70 nm, 50 nm and 50 nm, respectively. A resist mask 15 having a via hole pattern is formed on the fourth-mask forming layer 34.

Figure 5B:
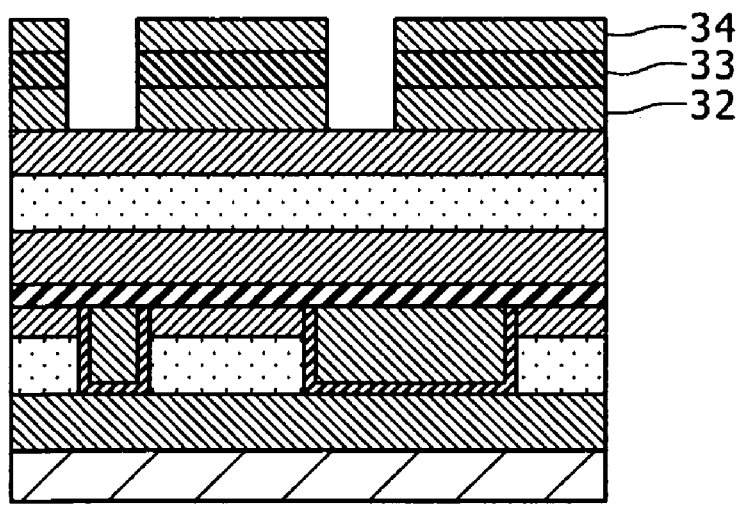
Figure 5C:
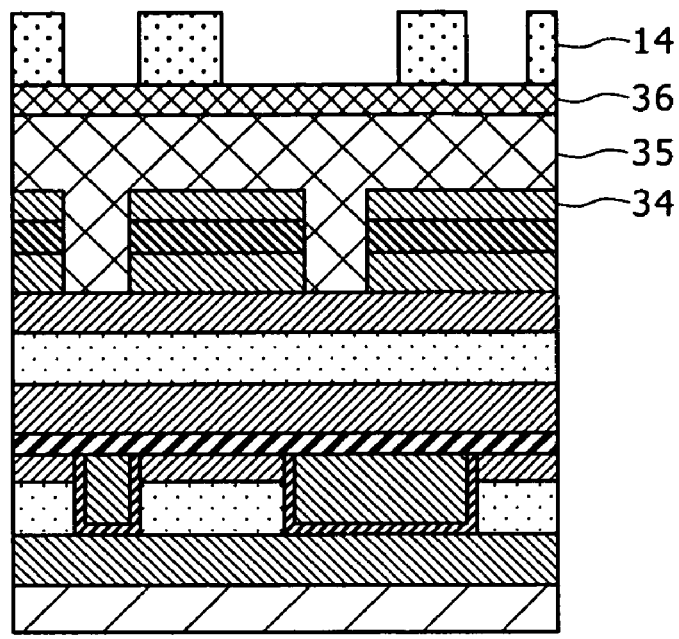

Referring next to FIG. 5B, the fourth-mask forming layer ($SiO_2$) 34, the third-mask forming layer (SiN) 33 and the second-mask forming layer ($SiO_2$) 32 are etched by dry etching that employs the resist mask 15 (see FIG. 5A) as the etching mask. Thus, a via hole pattern is formed in the fourth-mask forming layer 34, the third-mask forming layer 33 and the second-mask forming layer 32. Subsequently, ashing treatment based on $O_2$ plasma and chemical treatment are implemented for example, to thereby completely remove the resist mask 15 and residual fouling produced in the etching treatment.

Referring next to 12C, a planarization layer 35 composed of e.g. an organic material is formed on the fourth-mask forming layer 34 in a manner of filling the via hole pattern, and then a mask transfer layer 36 composed of e.g. $SiO_2$ is formed on the planarization layer 35. Subsequently, a resist mask 14 having an interconnect trench pattern is formed on the mask transfer layer 36.

Figure 5D:
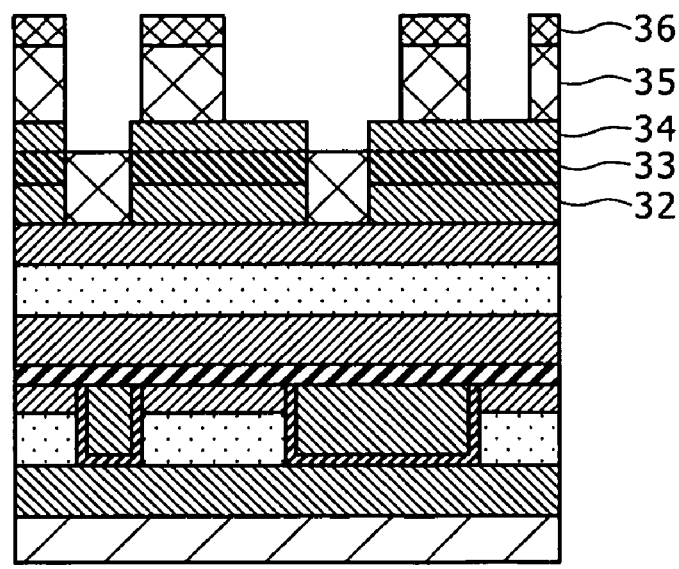

Referring next to FIG. 5D, the mask transfer layer 36 and the planarization layer 35 are formed by dry etching in which the resist mask 14 (see FIG. 5C) is used as the etching mask. This etching is carried out such that the planarization layer 35 remains in the via hole pattern formed in the fourth-mask forming layer 34, the third-mask forming layer 33 and the second-mask forming layer 32.

Figure 5E:
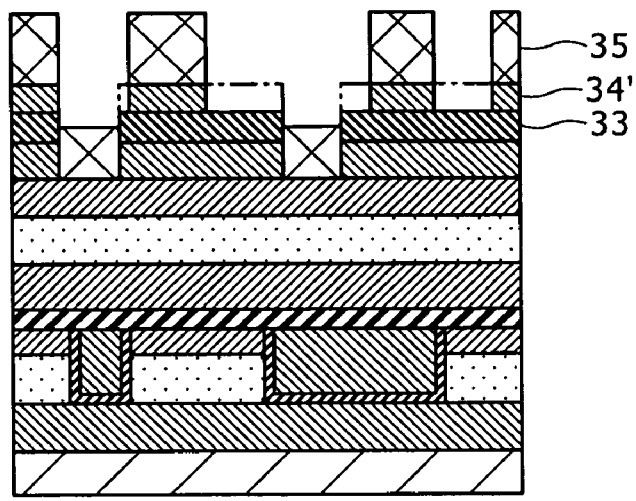

Referring next to FIG. 5E, the fourth-mask forming layer ($SiO_2$) 34 (see FIG. 5D) is etched by dry etching in which the mask transfer layer 36 (see FIG. 5D) and the planarization layer 35 that have the interconnect trench pattern are used as the mask. Thus, a fourth mask 34' having the interconnect trench pattern is formed. This etching exposes the third-mask forming layer (SiN) 33 having the via hole pattern at the bottom of the interconnect trench pattern of the fourth mask ($SiO_2$) 34'. The mask transfer layer 36 is removed in this etching.

Figure 5F:
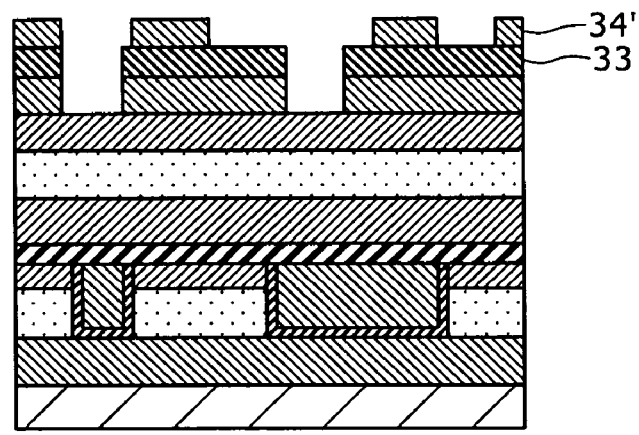

Subsequently, as shown in FIG. 5F, ashing treatment based on $O_2$ plasma and chemical treatment are implemented for example, to thereby completely remove the remaining planarization layer 35 (see FIG. 5E) and residual fouling produced in the etching treatment. Through the above-described steps, the fourth mask 34' having the interconnect trench pattern is formed on the third-mask forming layer 33 having the via hole pattern.

Figure 5G:
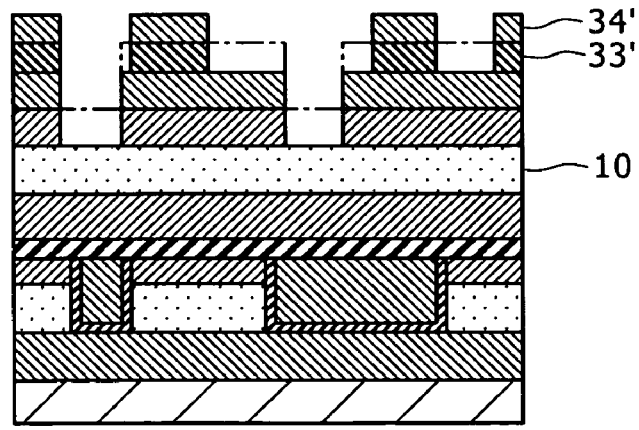

Referring next to FIG. 5G, the third-mask forming layer (SiN) 33 (see FIG. 5F) is etched by dry etching that employs the fourth mask ($SiO_2$) 34' having the interconnect trench pattern as the etching mask. Thus, a third mask 33' having the interconnect trench pattern is formed. Furthermore, in this etching, the via hole pattern is extended downward with the third-mask forming layer (SiN) 33 having the via hole pattern serving as the mask, so that the second insulating film (PAE) 10 is exposed. Thus, the via hole pattern is formed in the first-mask forming layer 31.

Figure 5H:
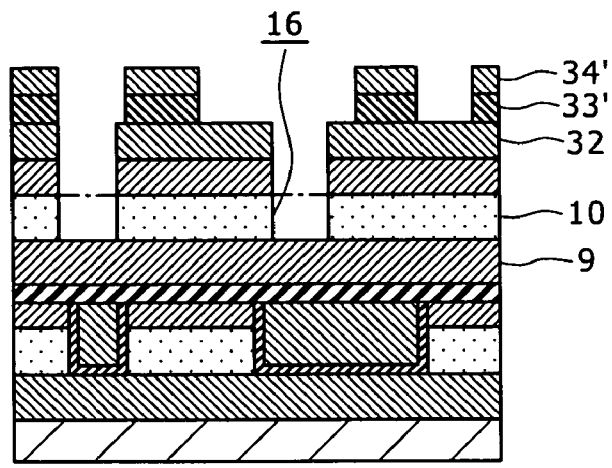

Subsequently, as shown in FIG. 5H, via holes 16 are opened in the second insulating film (PAE) 10 by dry etching that employs the second-mask forming layer 32 having the via hole pattern as the etching mask, so that the surface of the first insulating film (SiOC) 9 is exposed. In this etching, the etching selection ratio of PAE to $SiO_2$ is 100 or more. Therefore, this etching hardly reduces the thicknesses of the fourth mask ($SiO_2$) 34' and the second-mask forming layer ($SiO_2$) 32, which is exposed at the bottom of the interconnect trench pattern of the third mask 33'.

Figure 5I:
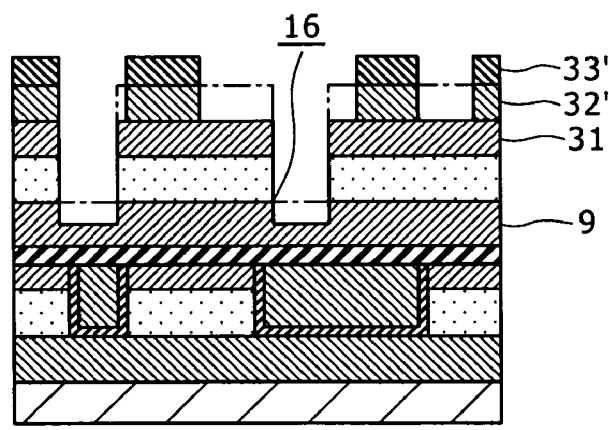

Referring next to FIG. 5I, the second-mask forming layer 32 (see FIG. 5H) having the via hole pattern is etched by dry etching in which the fourth mask 34' (see FIG. 5H) and the third mask 33' having the interconnect trench pattern are used as the etching mask. Thus, a second mask 32' having the interconnect trench pattern is formed. In this etching, the fourth mask 34' is removed in step with progress of etching of the second-mask forming layer ($SiO_2$) 32 since the fourth mask ($SiO_2$) 34' and the second-mask forming layer 32 are formed of the same material ($SiO_2$). Furthermore, this etching extends the via holes 16 downward partway across the first insulating film (SiOC) 9.

Figure 5J:
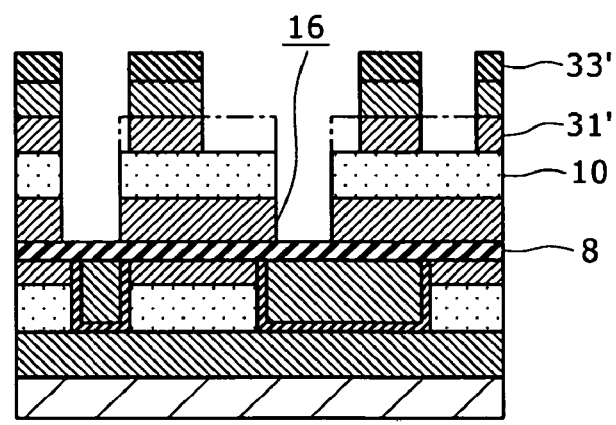
Figure 5K:
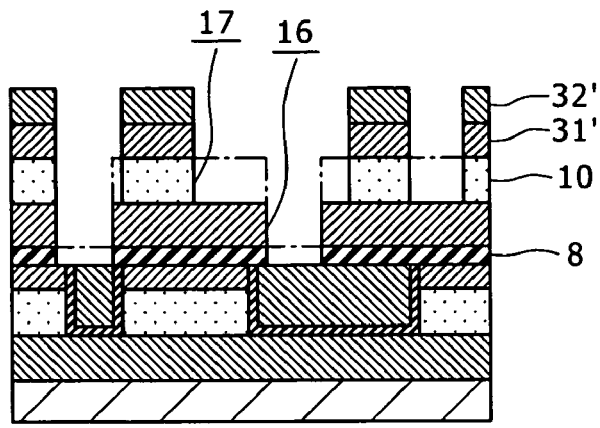

Referring next to FIG. 5J, the first-mask forming layer (SiOC) 31 (see FIG. 5I) is etched by dry etching that employs the third mask 33' having the interconnect trench pattern as the etching mask. Thus, a first mask 31' having the interconnect trench pattern is formed. Moreover, due to this etching, the via holes 16 are further extended downward with the first-mask forming layer (SiOC) 31 and the second insulating film 10 having the via hole pattern serving as the mask, so that the etching stopper film 8 is exposed.

The subsequent steps are carried out in the same way as the first embodiment. Specifically, referring next to FIG. 5K, the etching stopper film 8 remaining under the bottoms of the via holes 16 and the third mask (SiN) 33' (see FIG. 5J) are etch-removed. Subsequently, the second insulating film (PAE) 10 remaining under the bottom of the interconnect trench pattern in the first mask (SiOC) 31' is etched with use of the second mask ($SiO_2$) 32' as the etching mask. Thus, the interconnect trench pattern formed in the first mask 31' is extended downward, which results in the formation of interconnect trenches 17 in the second mask 32', the first mask 31' and the second insulating film 10.

After the above-described steps, by posttreatment employing chemicals and RF-sputtering treatment, etching fouling that remains on sidewalls of the interconnect trenches 17 and the via holes 16 are removed, and modified Cu layers at the bottoms of the via holes are converted to normal Cu layers.

Figure 5L:
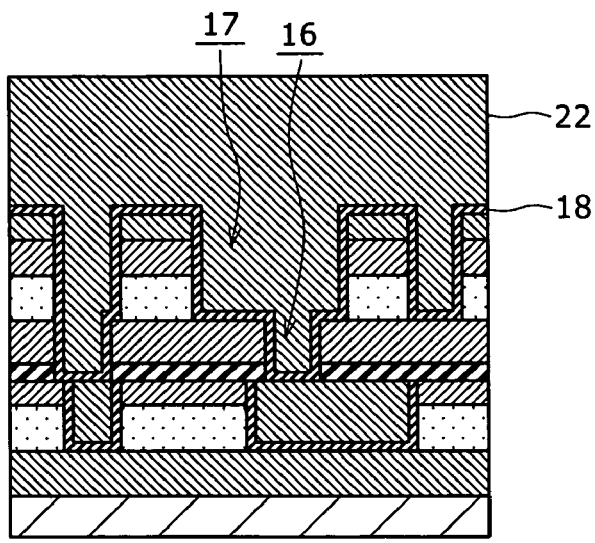

Thereafter, as shown in FIG. 5L, a barrier metal film 18 is deposited by sputtering in a manner of covering the inside walls of the interconnect trenches 17 and the via holes 16. Subsequently, a conductive film 22 composed of Cu is deposited on the barrier metal film 18 by electrolytic plating or sputtering in a manner of filling the interconnect trenches 17 and the via holes 16. Thus, the interconnect trenches 17 and the via holes 16 are simultaneously filled.

Figure 5M:
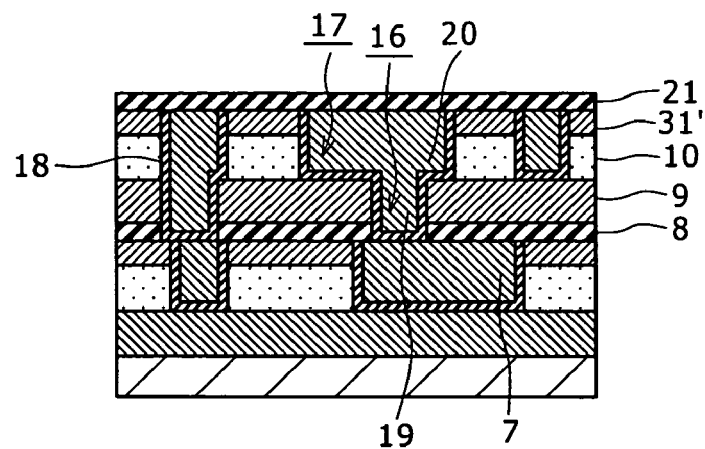

Referring next to FIG. 5M, by using CMP, extra part of the conductive film 22 (see FIG. 5L) and the barrier metal film 18 unnecessary as the interconnect pattern is removed. In addition, the whole second mask 32' and upper part of the first mask 31' are also removed. Thus, vias 19 are formed in the via holes 16 while Cu interconnects 20 are formed in the interconnect trenches 17. In this step, the polishing time period of the CMP is adjusted so that the thickness of the Cu interconnects 20 becomes 140 nm. Moreover, an etching stopper film 21 composed of e.g. SiC is formed on the Cu interconnects 20 and the first mask 31', similarly to the etching stopper film 8 on the lower Cu interconnects 7. Accordingly, a multilevel interconnect structure based on a dual damascene structure can be achieved.

According to the above-described manufacturing method of a semiconductor device, the first mask 31' is left on the second insulating film 10, and serves as a third insulating film that defines the interconnect trenches in association with the second insulating film 10. Since the first insulating film 9, the second insulating film 10 and the first mask 31' are each formed of a low-k material, the third embodiment can offer the same advantages as those of the first embodiment.

Moreover, since the whole second mask 32' and upper part of the first mask 31' in addition to extra part of the conductive film 22 unnecessary as the interconnect pattern are removed by CMP, the second mask 32' having a high dielectric constant can surely be removed. This ensured removal of the second mask 32' facilitates control of the dielectric constant compared with the case where polishing residues of the second mask 32' partially remain.

In the above-described first and second embodiments, the vias 19 and the Cu interconnects (upper interconnects) 20 are aligned with the Cu interconnects (lower interconnects) 7, and these two alignment steps induce misalignment between the vias 19 and the Cu interconnects 20. In contrast, in the third embodiment, the vias 19 are aligned with the Cu interconnects 7, and then the Cu interconnects 20 are aligned with the vias 19. Therefore, a margin for short-circuit between vias and interconnects at different potentials can be enlarged.

Note that features of the modifications of the first embodiment and features of the second embodiment are available also in the third embodiment.

FIRST WORKING EXAMPLE

Figure 6:
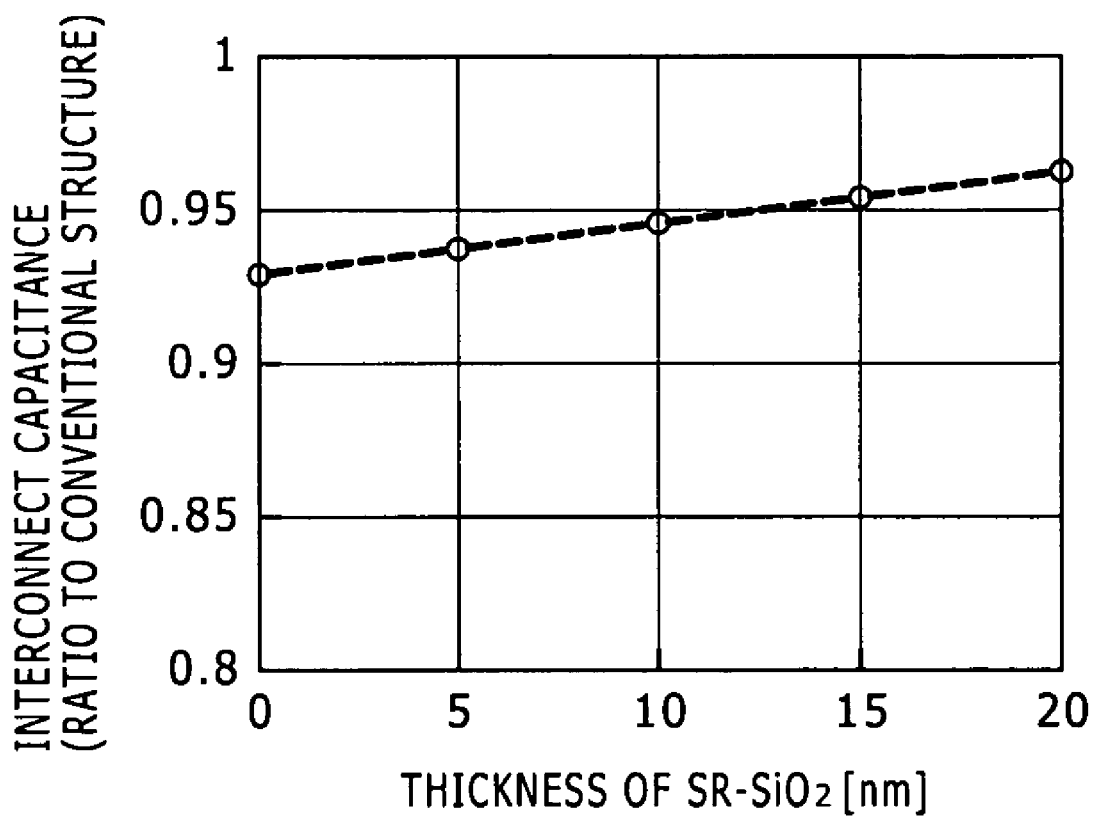
FIG. 6 is a graph showing the interconnect capacitances of semiconductor devices according to a first working example of the present invention, as a function of the thickness of an etching stopper film.
Figure 7A:
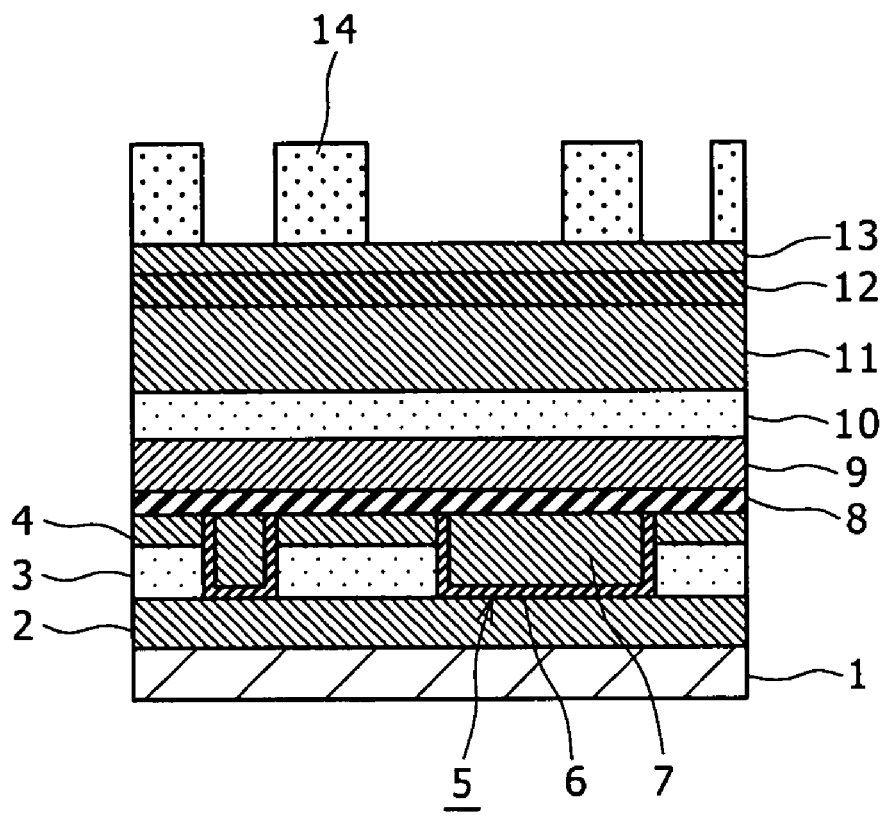
FIGS. 7A to 7H are sectional views for explaining manufacturing steps of a conventional method of manufacturing a semiconductor device.
Figure 7B:
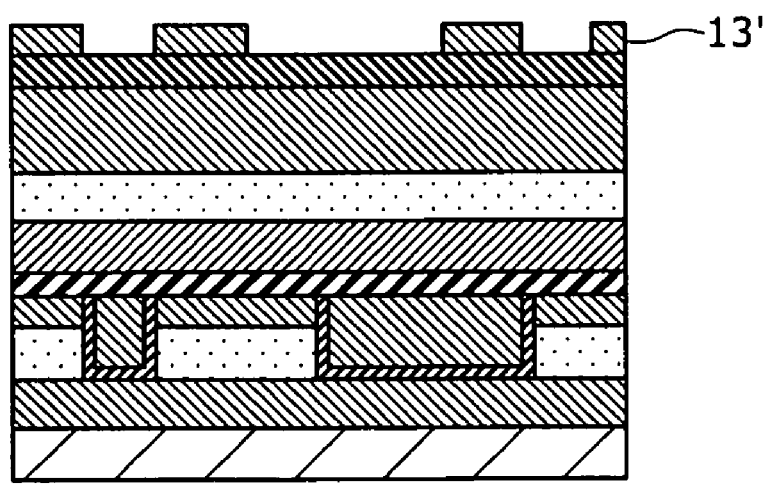
Figure 7C:
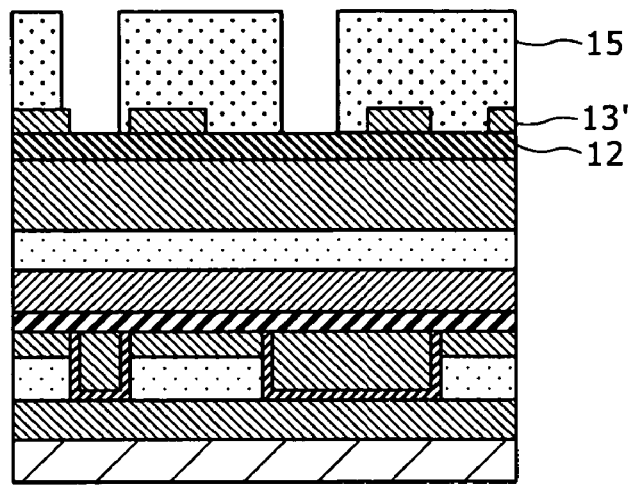
Figure 7D:
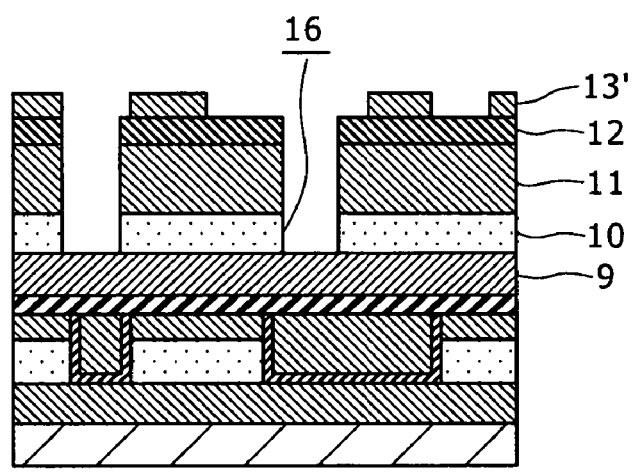
Figure 7E:
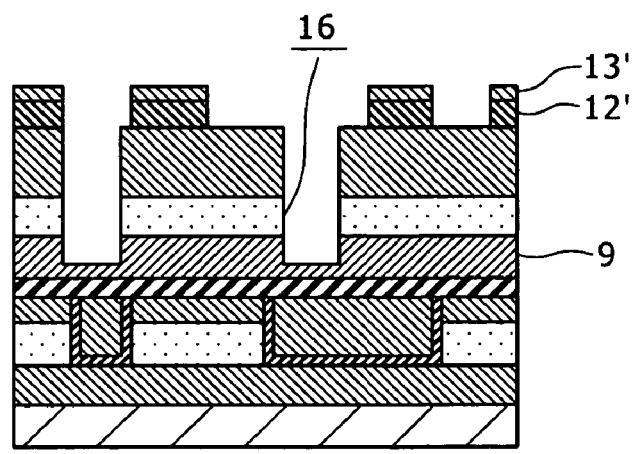
Figure 7F:
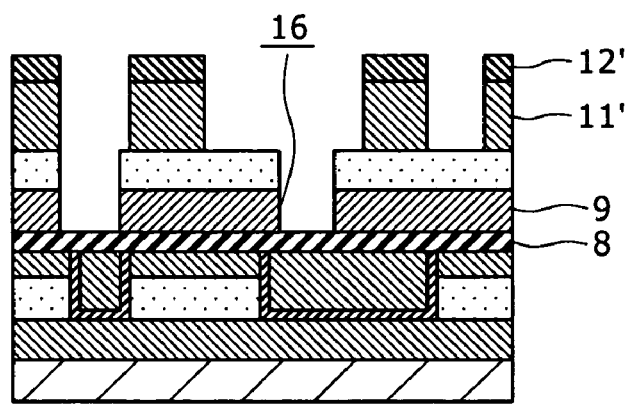
Figure 7G:
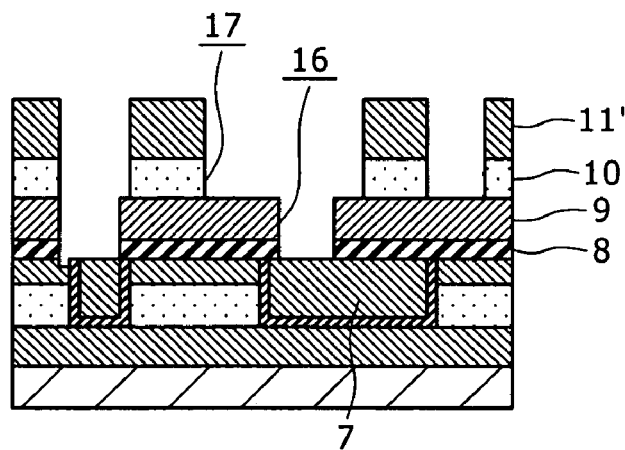
Figure 7H:
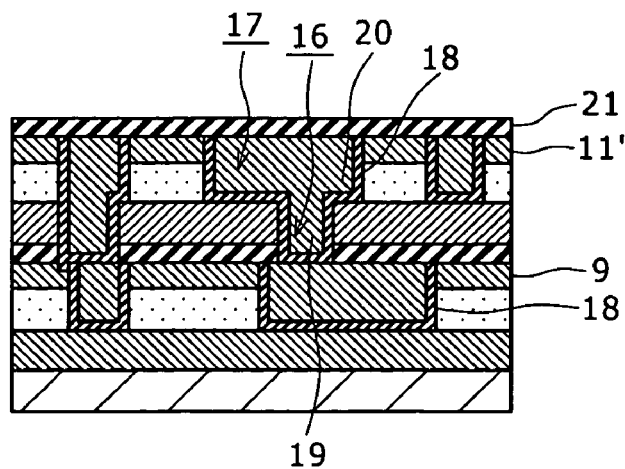
Figure 8A:
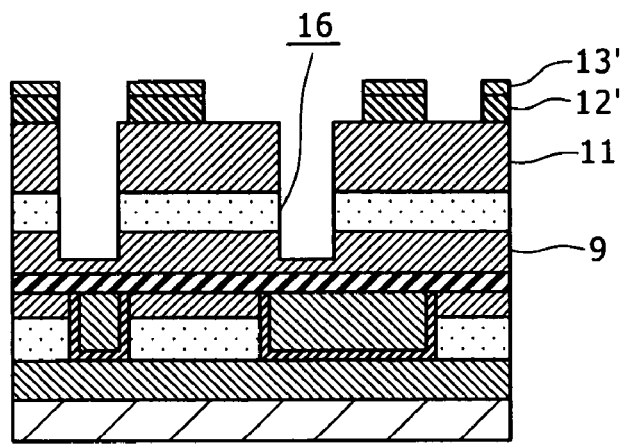
FIGS. 8A to 8C are sectional views for explaining problems in the conventional method of manufacturing a semiconductor device.
Figure 8B:
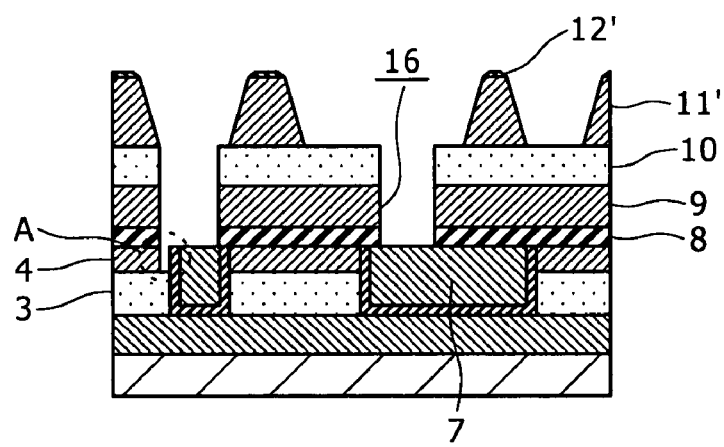
Figure 8C:
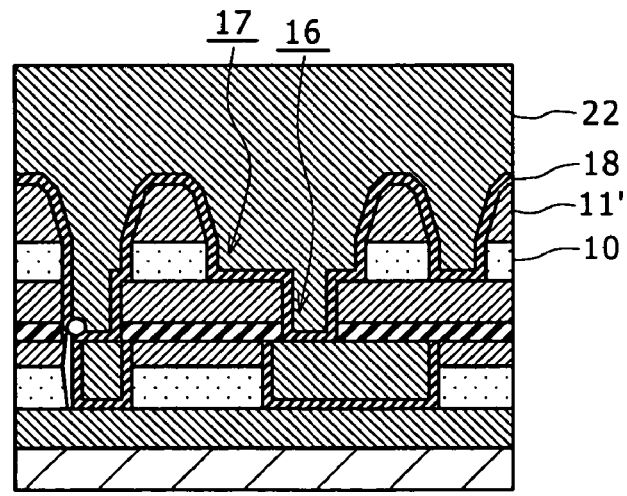
Figure 9:
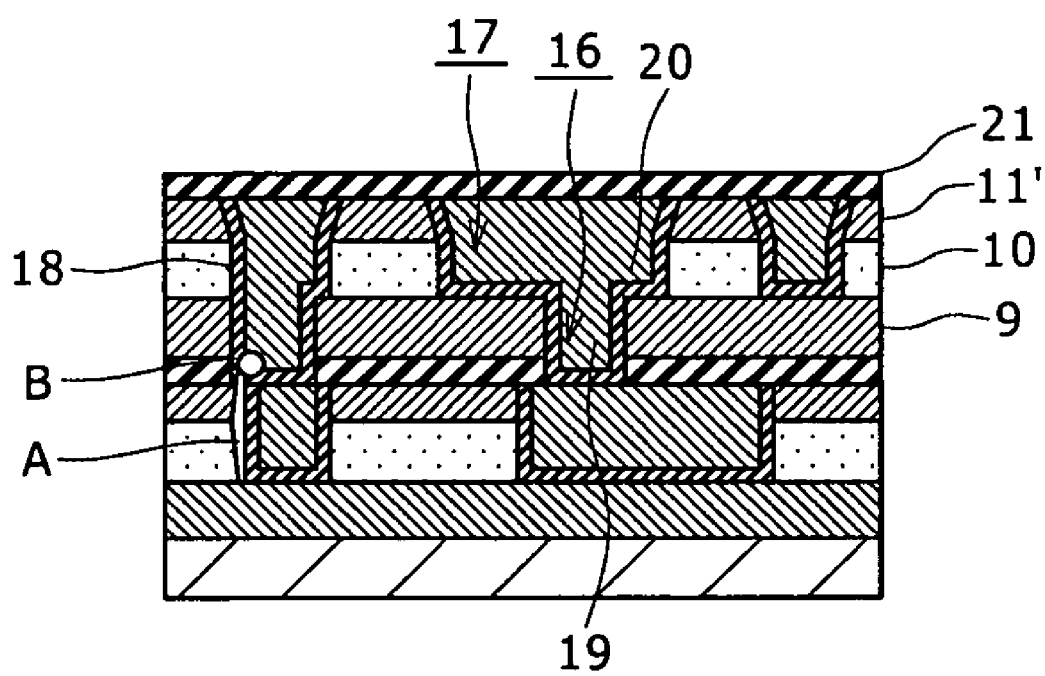
FIG. 9 is a sectional view for explaining the problems in the conventional method of manufacturing a semiconductor device.

Semiconductor devices were manufactured by the same method as that of the second embodiment, with the thickness of the second etching stopper film (SR—$SiO_2$) 8b being changed on each device basis from 5 nm to 20 nm by an increment of 5 nm. The interconnect capacitances of the manufactured devices were measured. In addition, a semiconductor device having no second etching stopper film 8b (i.e., the thickness thereof was 0 nm) was also manufactured by the same method as that of the first embodiment, and the interconnect capacitance thereof was measured. FIG. 6 is a graph showing the measurement results of the interconnect capacitances of these semiconductor devices. Note that the interconnect capacitances are indicated as the ratio with respect to the interconnect capacitance of the semiconductor device in FIG. 7H. That is, the interconnect capacitance of the device in FIG. 7H is defined as 1.

This graph shows that, when the thickness of the second etching stopper film 8b is 20 nm or smaller, an interconnect capacitance smaller by 3 to 7% than that of the semiconductor device with the conventional structure is obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device having an insulating film that includes a low dielectric constant (low-k) material film having a dielectric constant smaller than a dielectric constant of silicon dioxide, the method comprising the steps of:

(a) sequentially forming a first insulating film and a second insulating film over a substrate that includes a conductive layer pattern in a region including a front surface of the substrate, the first insulating film serving as an interlayer insulating film between interconnect layers and being composed of a low-k material, the second insulating film serving as an insulating film among interconnects and being composed of a low-k material different from the material of the first insulating film;

(b) sequentially forming a first-mask forming layer, a second-mask forming layer, a third-mask forming layer, and a fourth-mask forming layer over said second insulating film, the first-mask forming layer being composed of a low-k material different from the material of the second insulating film, the second-mask forming layer being composed of an insulating material different from the material of the first-mask forming layer, the third-mask forming layer being composed of an insulating material different from the material of the second-mask forming layer, the fourth-mask forming layer being composed of an insulating material different from the third-mask forming layer;

(c) patterning said fourth-mask forming layer to thereby form a fourth mask having an interconnect trench pattern;

(d) forming a resist mask having a via hole pattern on said fourth mask and said third-mask forming layer;

(e) with use of said resist mask as an etching mask, etching said fourth mask, said third-mask forming layer, said second-mask forming layer, and said first-mask forming layer and etching said second insulating film, to thereby open a via hole;

(f) with use of said fourth mask as an etching mask, etching said third-mask forming layer to thereby form a third mask having the interconnect trench pattern, and etching said first insulating film to an intermediate thickness of said first insulating film to thereby extend said via hole downward;

(g) with use of said fourth mask and said third mask as an etching mask, etching said second-mask forming layer to thereby form a second mask having the interconnect trench pattern, and etching said first insulating film that remains under the bottom of said via hole to thereby extend said via hole downward so that said via hole reaches said substrate, said fourth mask being removed as a result of the etching of said second-mask forming layer;

(h) etching said first-mask forming layer with use of said third mask as an etching mask, to thereby form a first mask having the interconnect trench pattern;

(i) after removal of said third mask, forming an interconnect trench in said second insulating film with use of said second mask as an etching mask; and (j) removing said second mask after the forming of the interconnect trench.

2. The method of manufacturing the semiconductor device according to claim 1, wherein:

in said step (a), an etching stopper film that prevents said substrate being etched in the etching of said steps (g) and (h) is formed on said substrate, and said first insulating film and said second insulating film are sequentially formed over the etching stopper film;

in said step (g), said via hole is extended downward so that said via hole reaches said etching stopper film; and in said step (i), said etching stopper film is removed in addition to said third mask.

3. The method of manufacturing the semiconductor device according to claim 2, wherein:

said etching stopper film includes a first etching stopper film and a second etching stopper film, the first etching stopper film being provided on said substrate and preventing diffusion of a conductive material from said conductive layer pattern, the second etching stopper film being provide on the first etching stopper film; and said second etching stopper film is composed of a material that is less susceptible to being etched in the etching of said step (h) than a material of said first etching stopper film.

4. The method of manufacturing the semiconductor device according to claim 3, wherein said second etching stopper film is composed of silicon oxide having high silicon content.

5. The method of manufacturing the semiconductor device according to claim 1, further comprising between said step (i) and said step (j):

forming a conductive film on said second mask in a manner of filling the interconnect trench pattern of said second mask and said first mask, said interconnect trench, and said via hole, wherein in said step (j), extra part of said conductive film unnecessary as an interconnect pattern is removed in addition to said second mask by chemical mechanical polishing.

6. The method of manufacturing the semiconductor device according to claim 1, wherein in said step (j), said second mask is removed such that part of said second mask of a thin film shape remains on the whole or part of said first mask.

* * * * *